(12) United States Patent
Masuoka et al.

(10) Patent No.: US 9,041,095 B2
(45) Date of Patent: May 26, 2015

(54) VERTICAL TRANSISTOR WITH SURROUNDING GATE AND WORK-FUNCTION METAL AROUND UPPER SIDEWALL, AND METHOD FOR MANUFACTURING THE SAME

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/161,068

(22) Filed: Jan. 22, 2014

(65) Prior Publication Data

US 2014/0203353 A1    Jul. 24, 2014

Related U.S. Application Data

(60) Provisional application No. 61/756,198, filed on Jan. 24, 2013.

(51) Int. Cl.
 H01L 29/78    (2006.01)
 H01L 21/336   (2006.01)
 H01L 29/66    (2006.01)

(52) U.S. Cl.
 CPC ...... *H01L 29/7827* (2013.01); *H01L 29/66666* (2013.01)

(58) Field of Classification Search
 None
 See application file for complete search history.

(56) References Cited

U.S. PATENT DOCUMENTS 7,982,260 B2 *  7/2011  Fukuzumi et al. ............ 257/324
8,080,458 B2 * 12/2011  Masuoka et al. .............. 438/268

(Continued)

FOREIGN PATENT DOCUMENTS

| JP | 02071556 | 3/1990 |
| JP | 02188966 | 7/1990 |
| JP | 03145761 | 6/1991 |

(Continued)

*Primary Examiner* — Marcos D. Pizarro
*Assistant Examiner* — Younes Boulghassoul
(74) *Attorney, Agent, or Firm* — Laurence A. Greenberg; Werner H. Stemer; Ralph E. Locher

(57) ABSTRACT

A method of manufacturing a semiconductor device includes a first step of forming a fin-shaped semiconductor layer, a first insulating film around the fin-shaped semiconductor layer, and a pillar-shaped semiconductor layer on the fin-shaped semiconductor layer. A second step forms a gate insulating film around the pillar-shaped semiconductor layer, a gate electrode around the gate insulating film, and a gate line. A third step forms a first first-conductivity-type diffusion layer in an upper portion of the pillar-shaped semiconductor layer and a second first-conductivity-type diffusion layer in a lower portion of the pillar-shaped semiconductor layer and an upper portion of the fin-shaped semiconductor layer. A fourth step includes depositing, planarizing, and etching-back a first interlayer insulating film to expose an upper portion of the pillar-shaped semiconductor layer, depositing a first metal, and etching the metal to form a first sidewall around the upper portion of the pillar-shaped semiconductor layer.

13 Claims, 34 Drawing Sheets

(56) References Cited

U.S. PATENT DOCUMENTS

2004/0188725 A1\* 9/2004 Fujiwara et al. ............. 257/288
2004/0262681 A1\* 12/2004 Masuoka et al. ............. 257/335
2010/0187600 A1\* 7/2010 Masuoka et al. ............. 257/329
2011/0042740 A1\* 2/2011 Masuoka et al. ............. 257/329
2011/0303973 A1 12/2011 Masuoka et al.
2014/0084386 A1\* 3/2014 Takeda et al. ................ 257/408

FOREIGN PATENT DOCUMENTS

| JP | H11297984 A | 10/1999 |
| JP | 2009182317 A | 8/2009 |
| JP | 2010251678 | 11/2010 |
| JP | 2010258345 | 11/2010 |
| JP | 2011040682 | 2/2011 |
| JP | 2012004244 A | 1/2012 |

\* cited by examiner

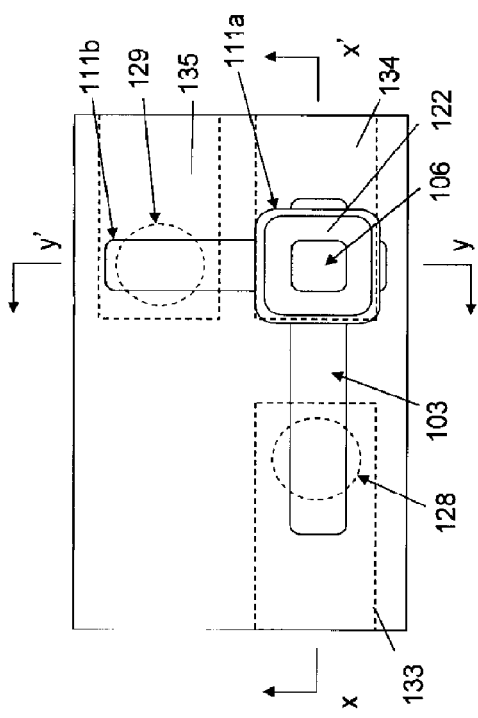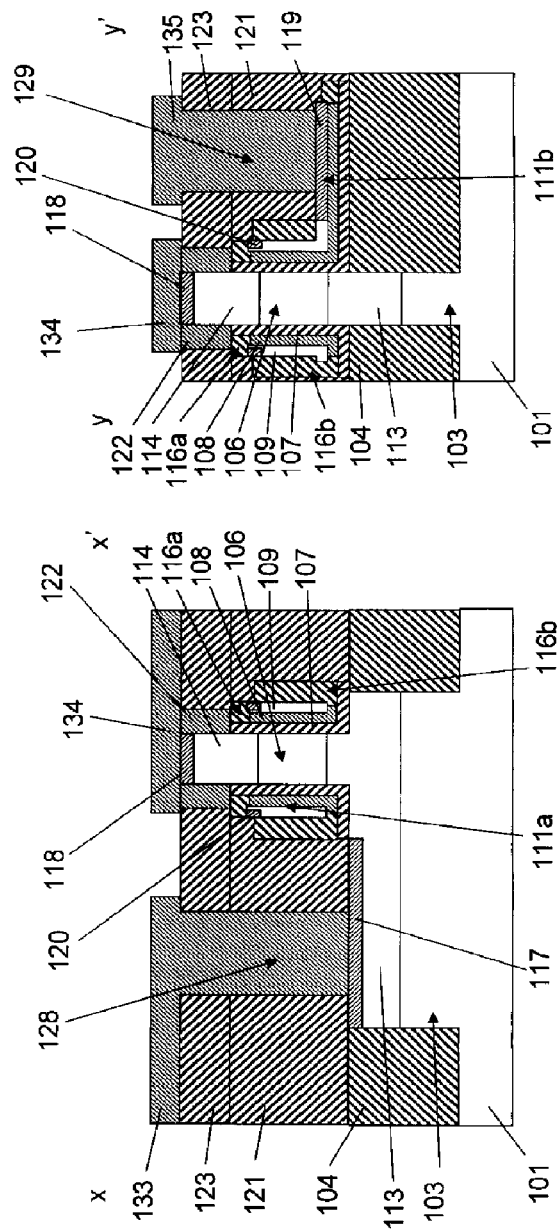

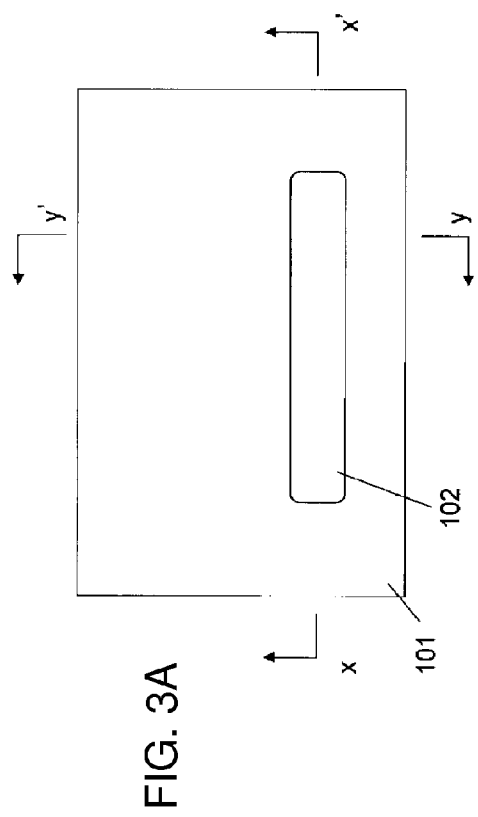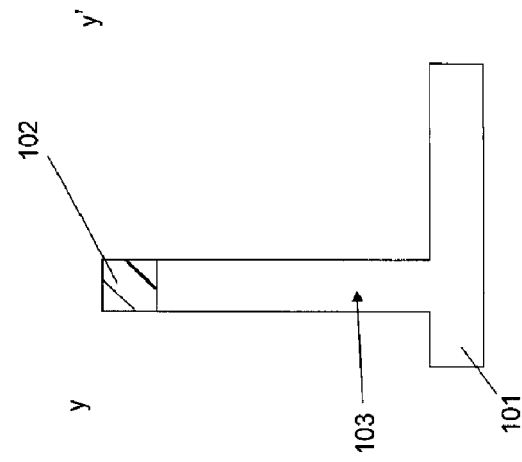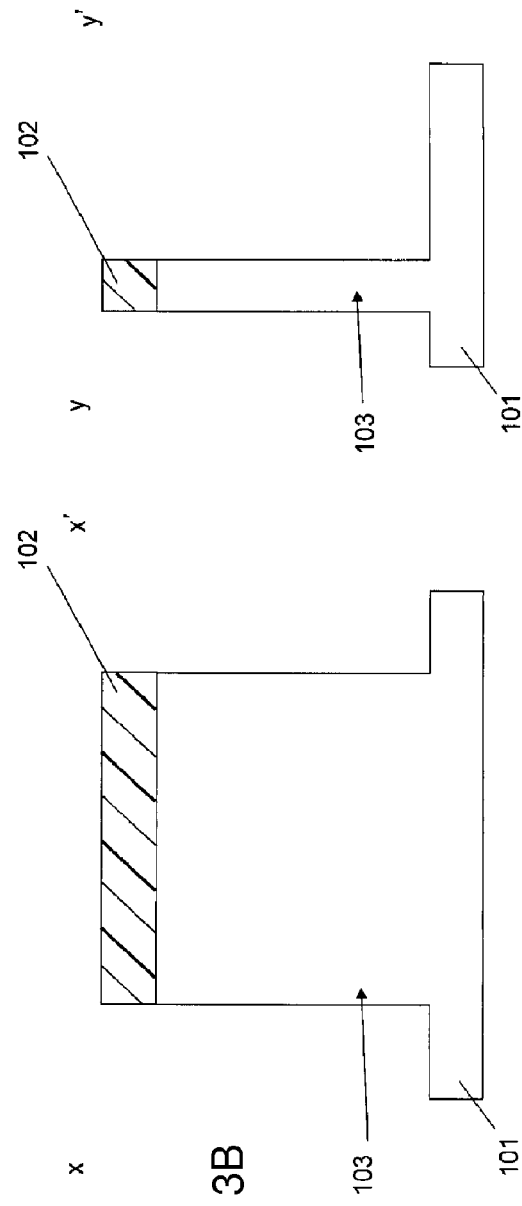

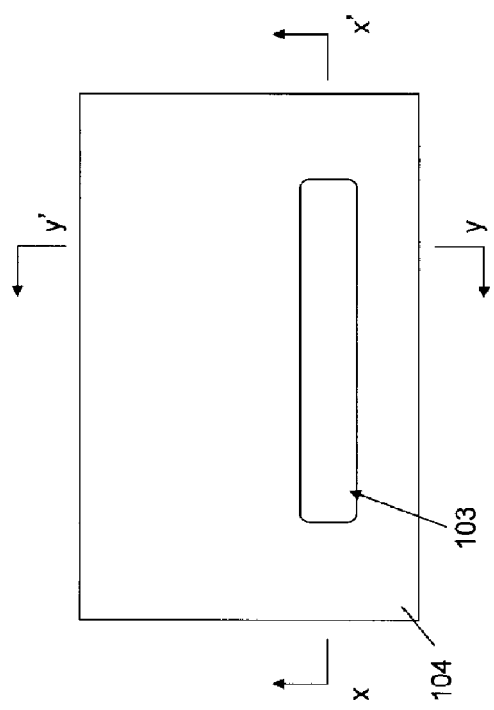
FIG. 5A
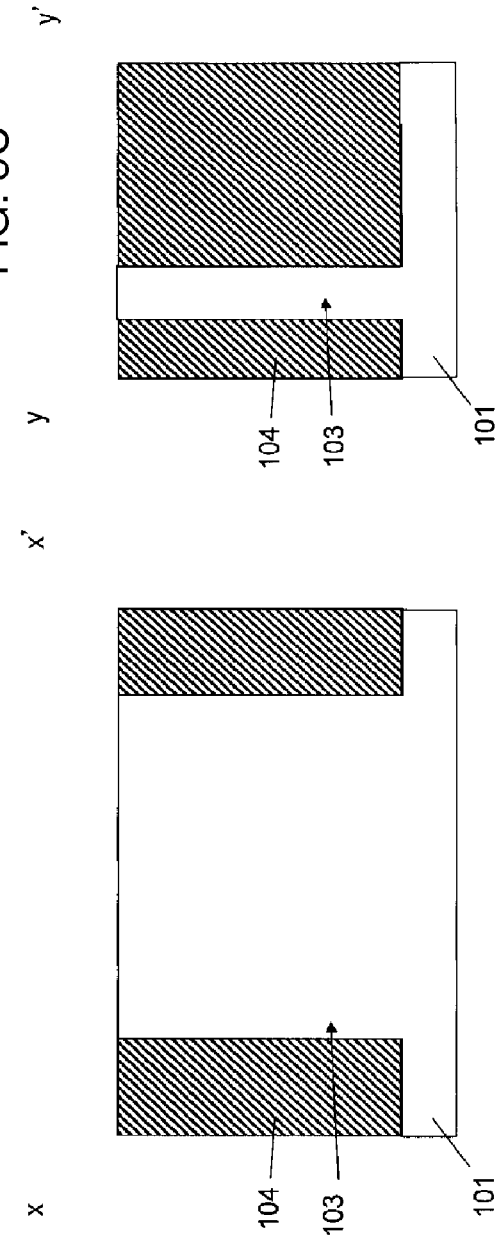
FIG. 5C
FIG. 5B

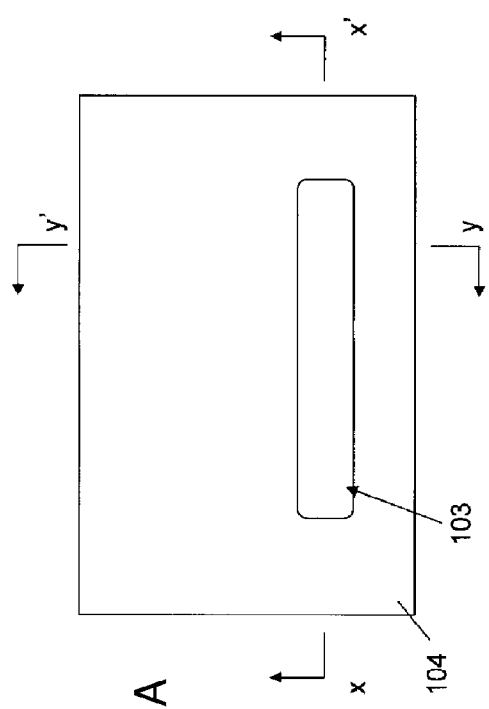
FIG. 6A
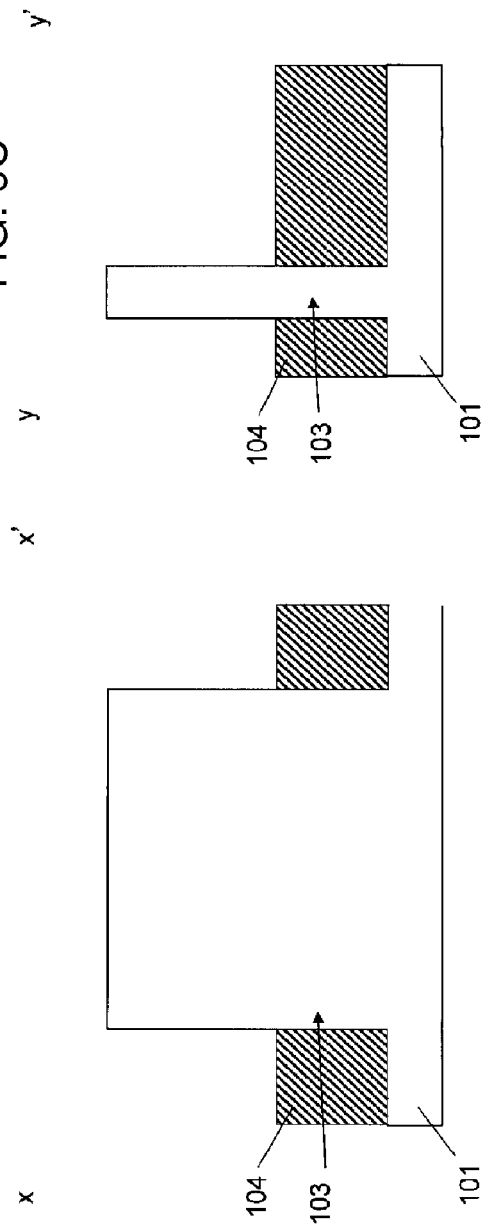
FIG. 6C
FIG. 6B

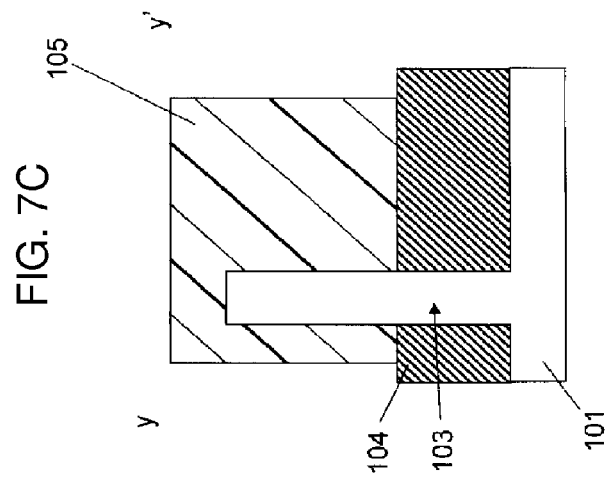
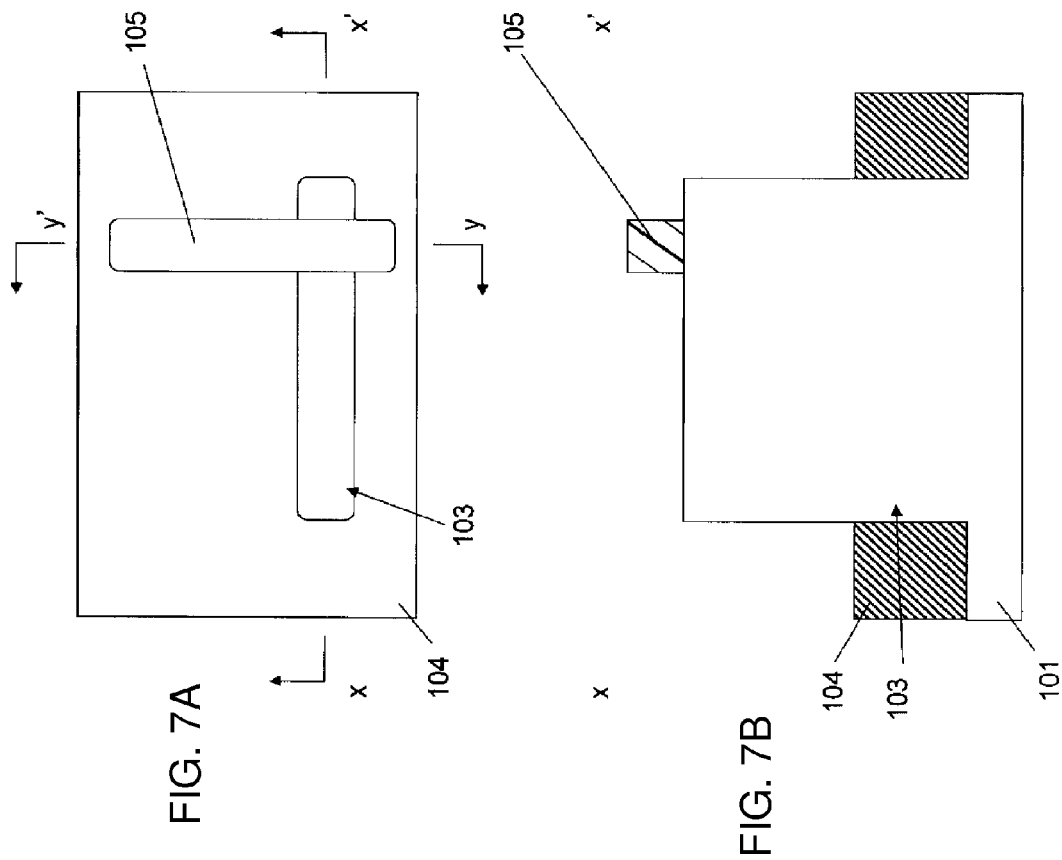

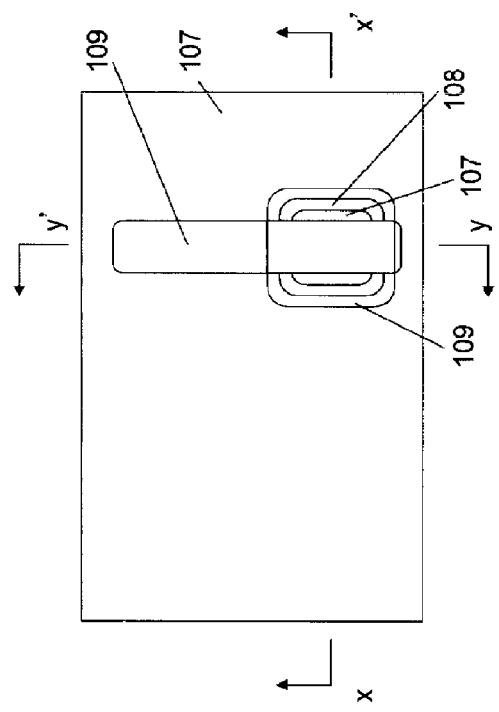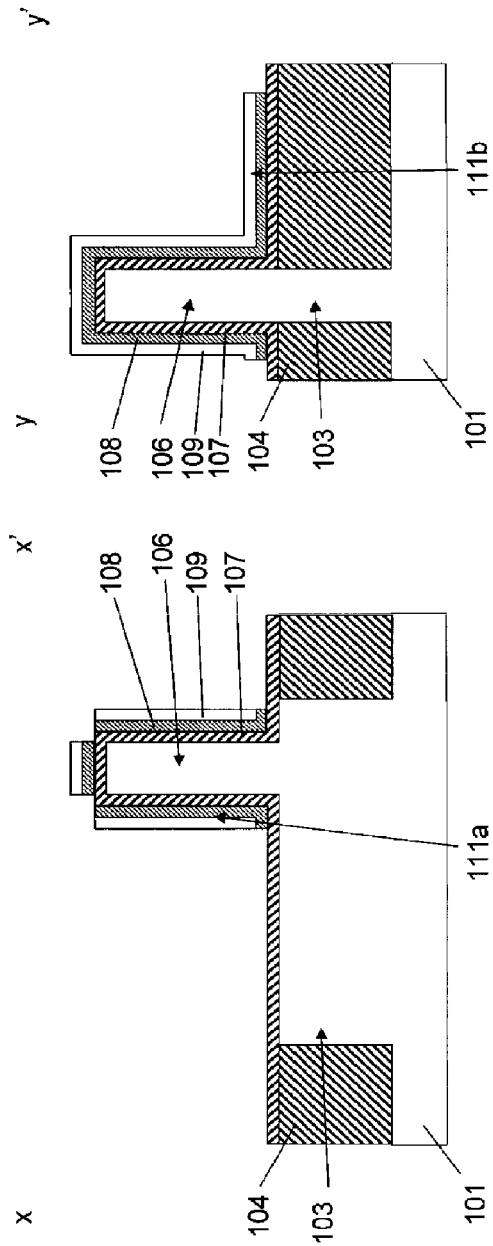

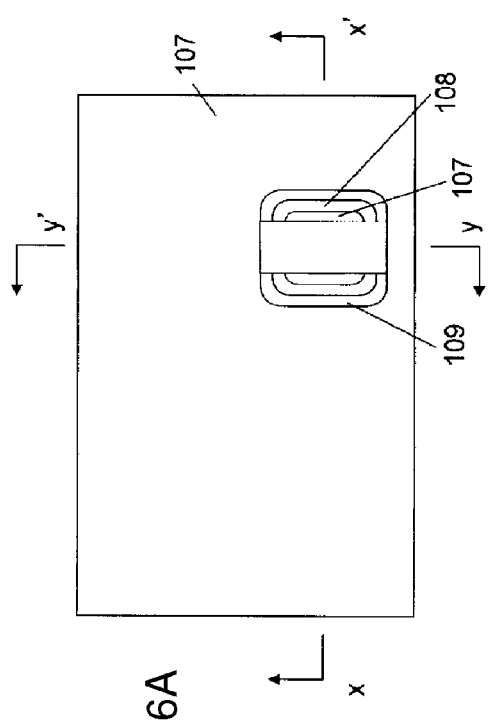
FIG. 16A
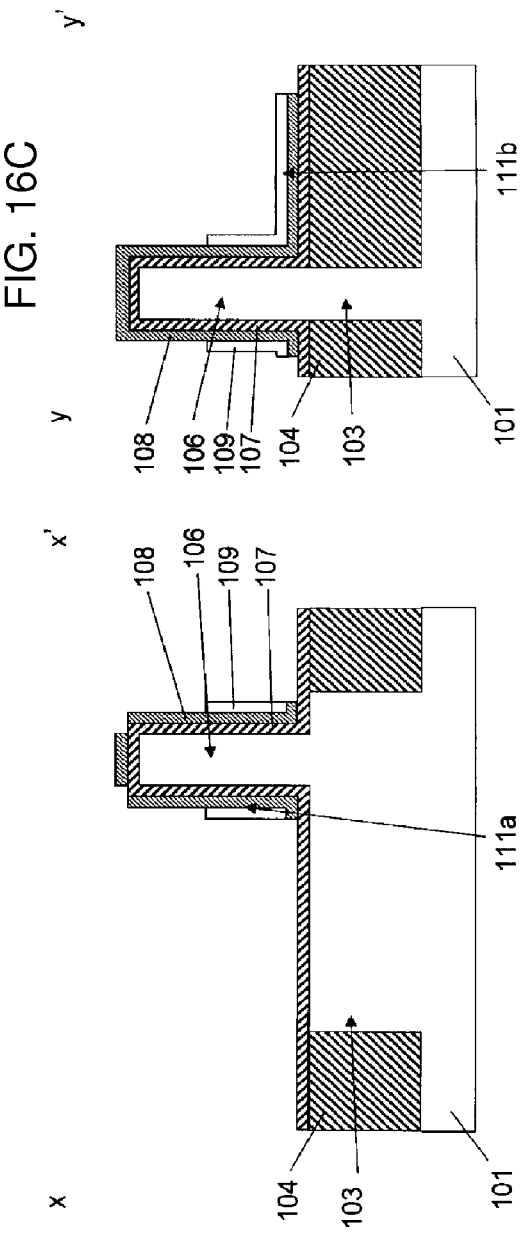
FIG. 16B
FIG. 16C

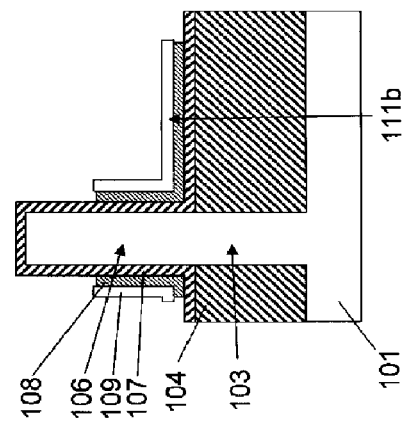
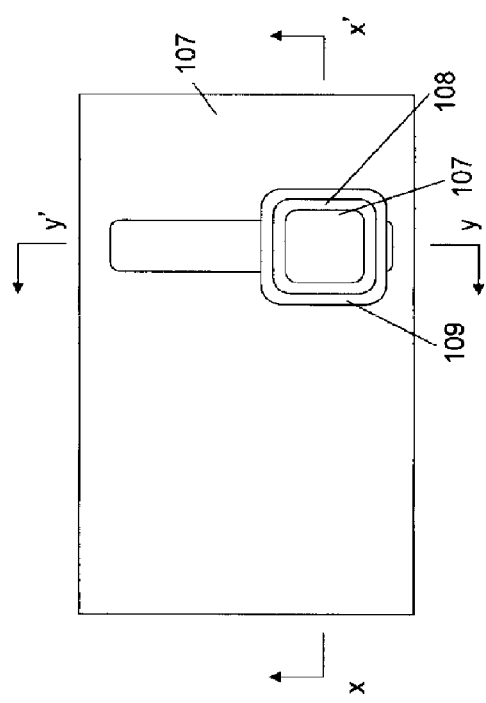
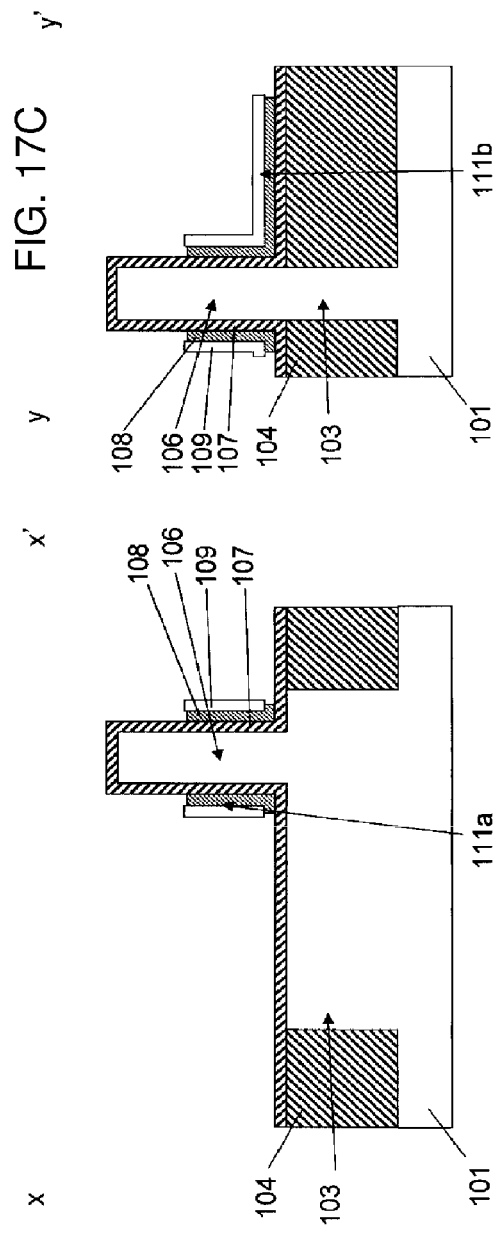

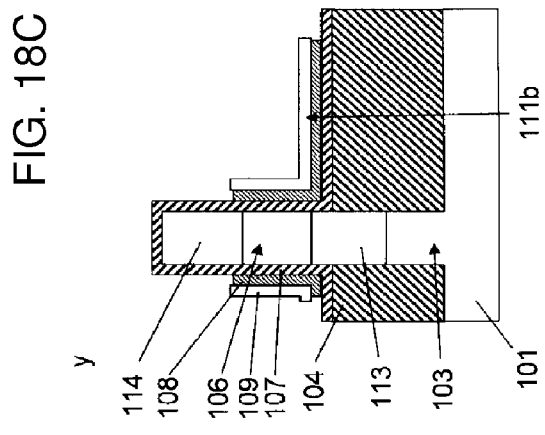
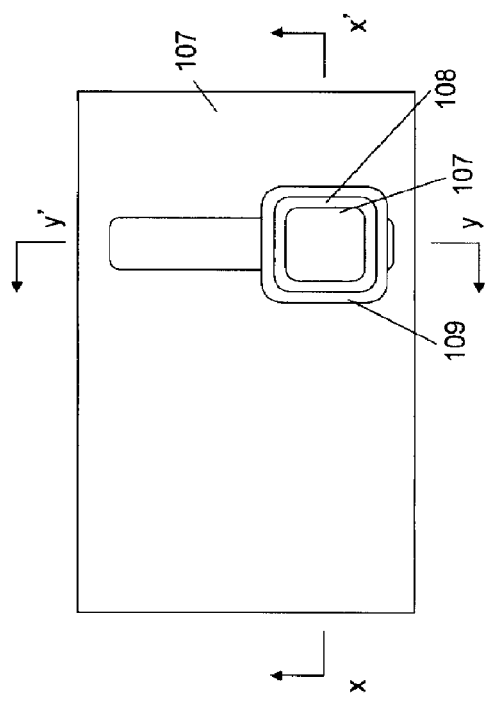
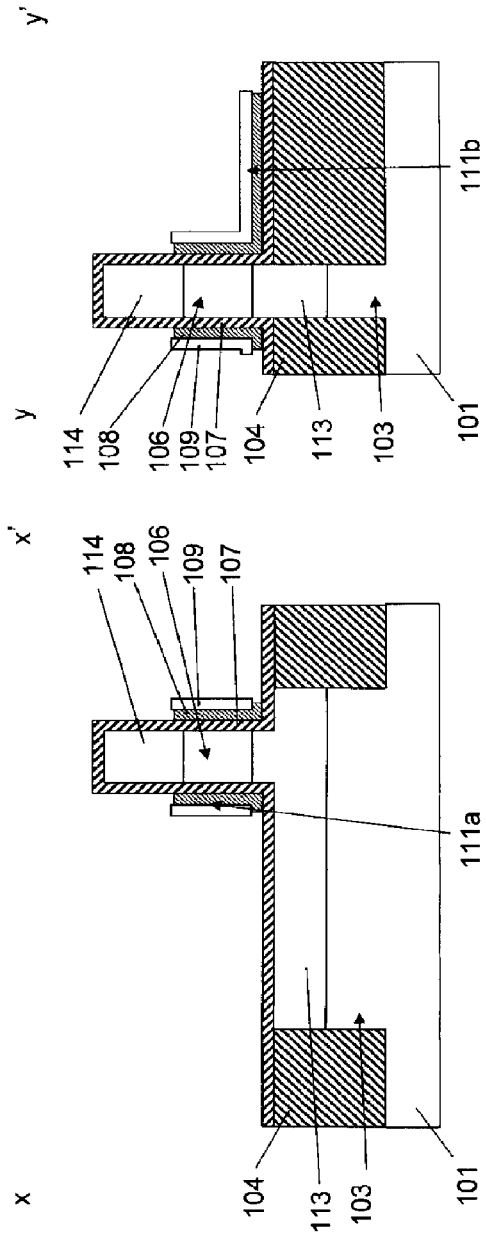

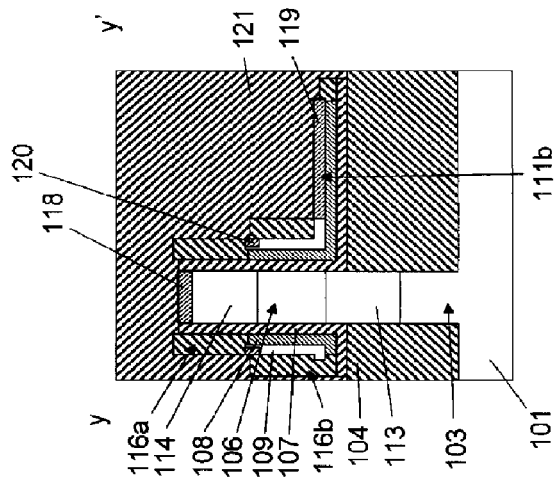
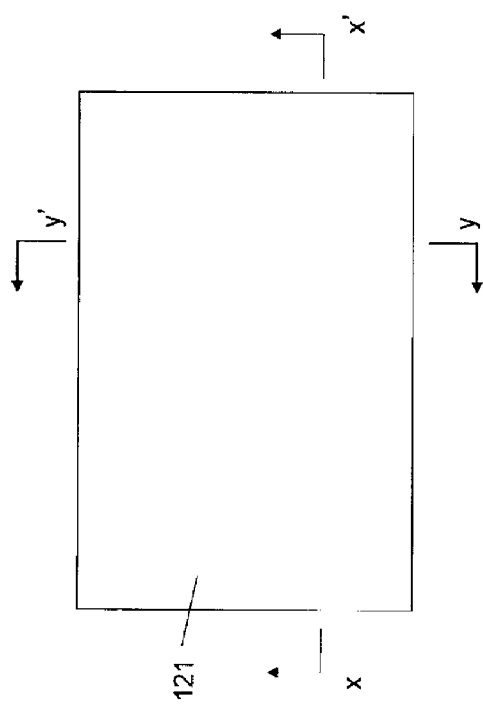
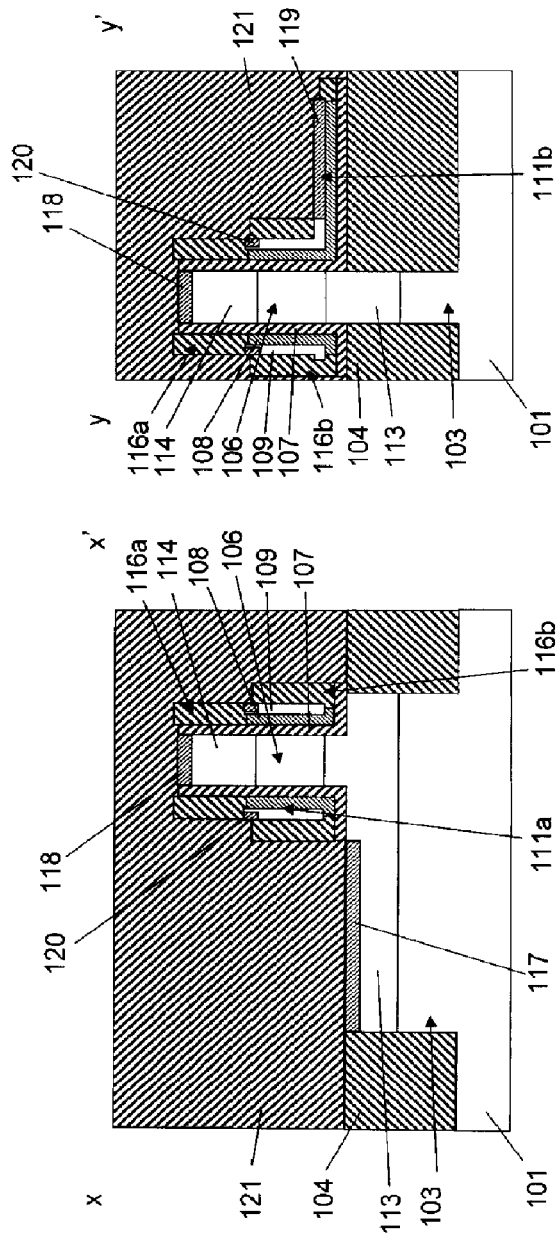
FIG. 22A
FIG. 22B
FIG. 22C

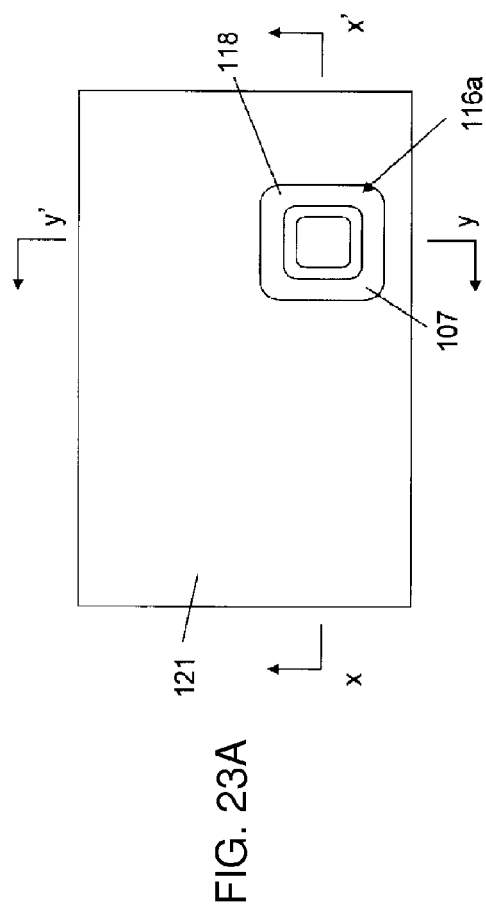
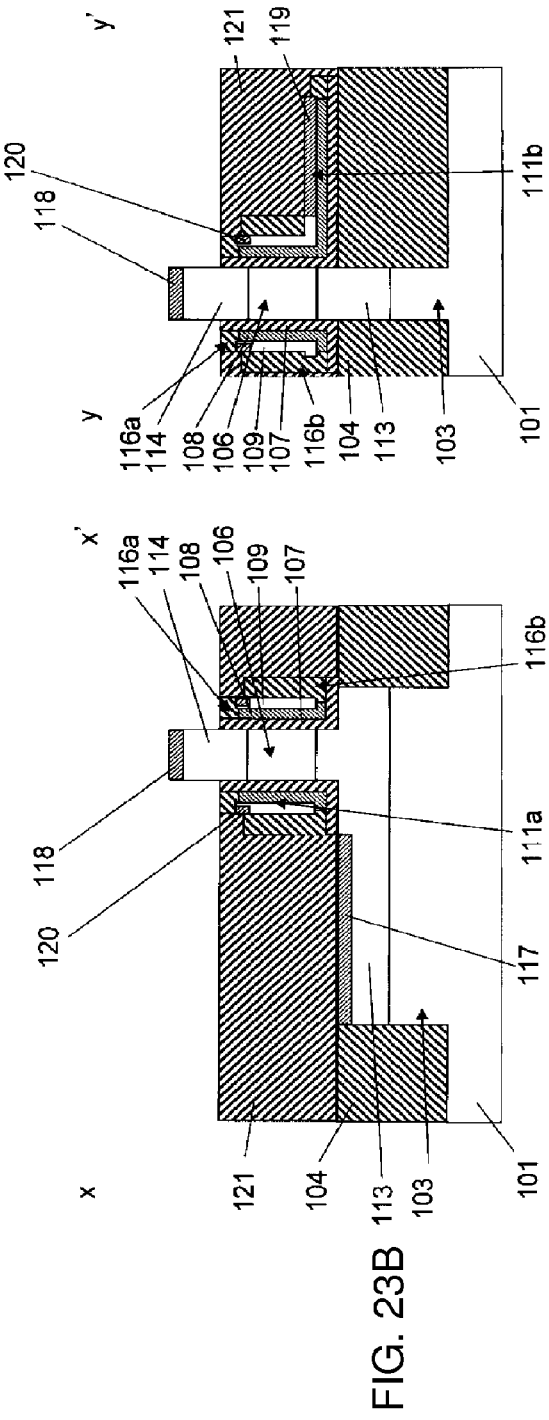
FIG. 23A
FIG. 23B
FIG. 23C

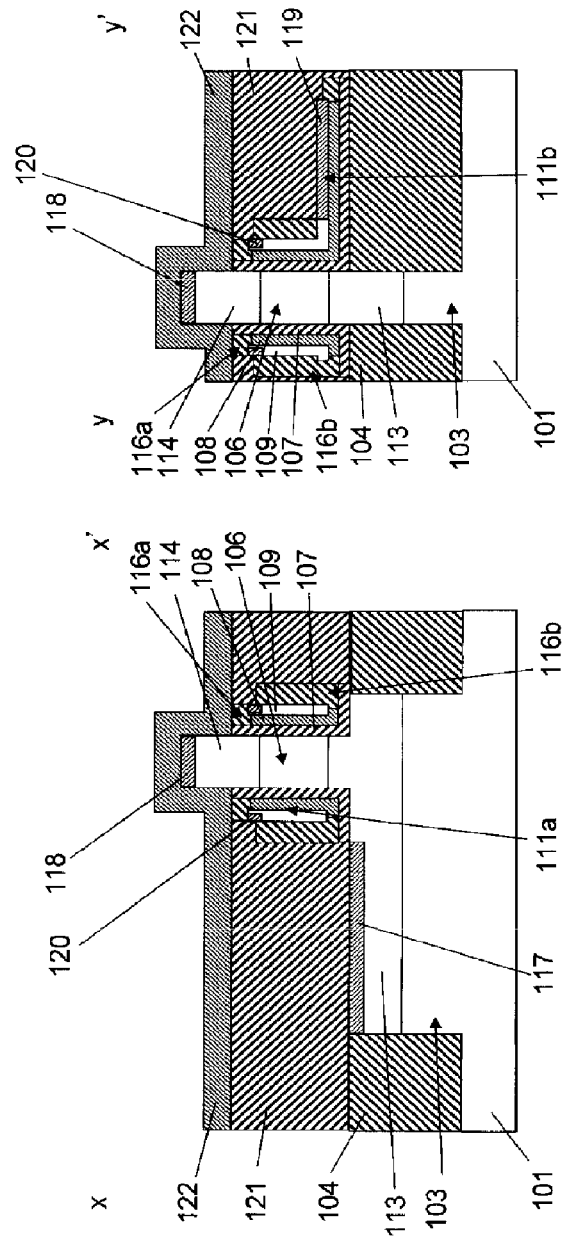
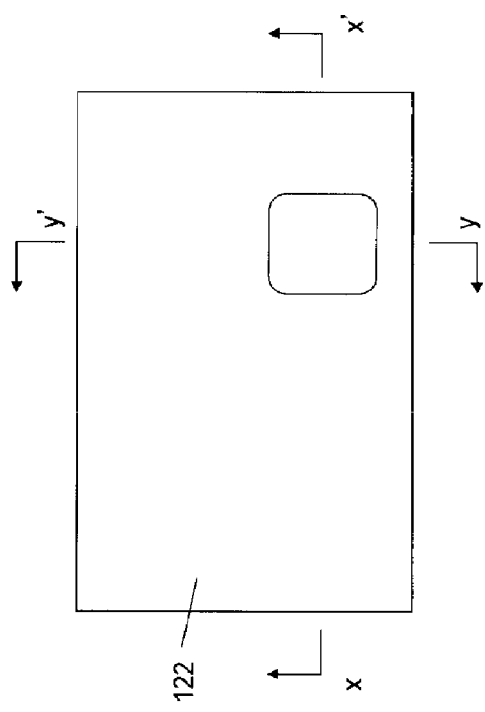
FIG. 24A
FIG. 24B
FIG. 24C

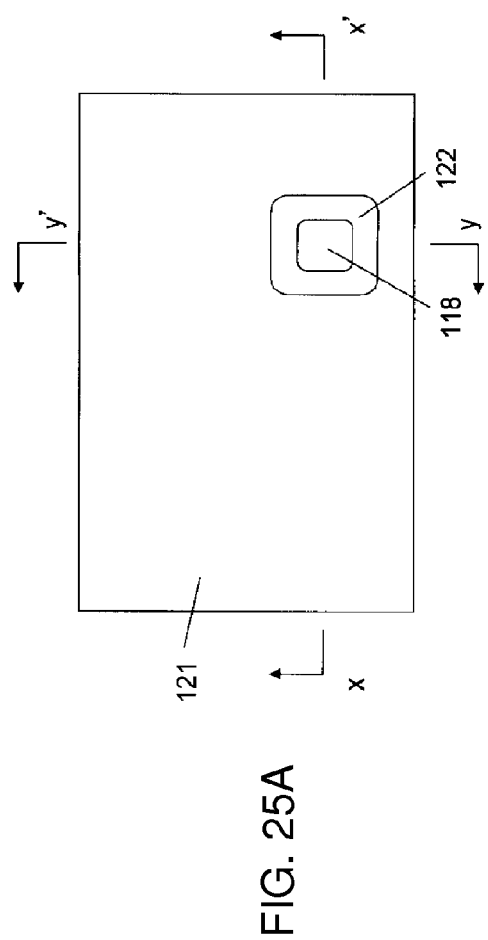
FIG. 25A
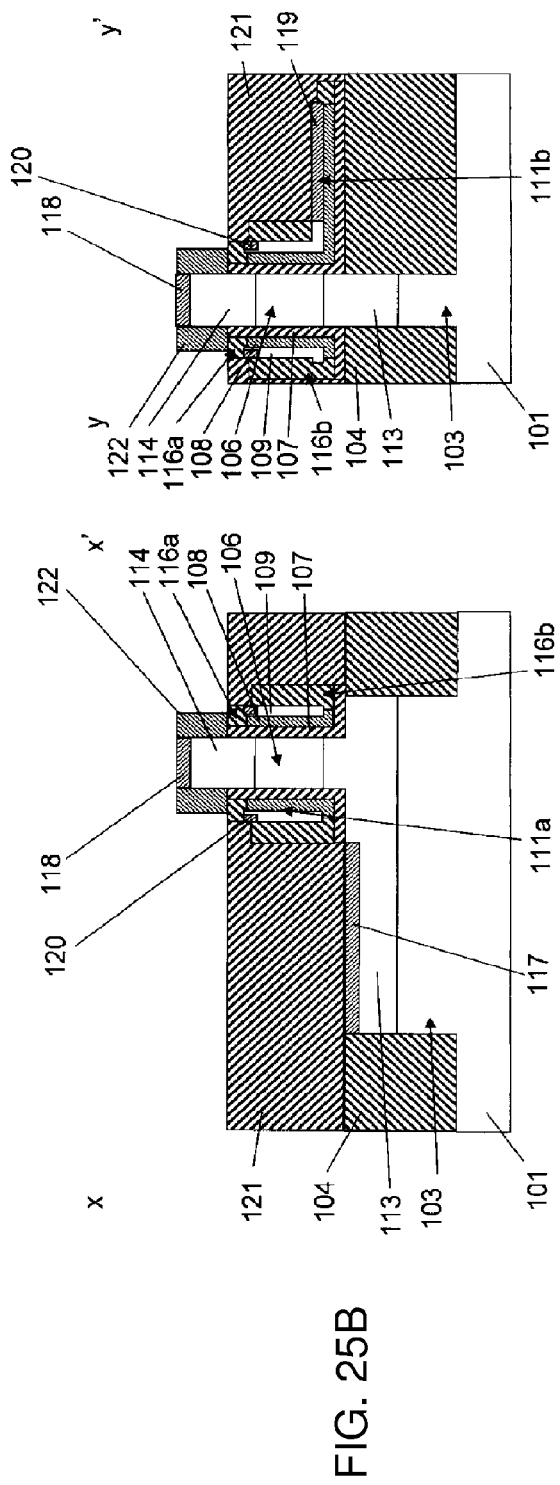
FIG. 25B
FIG. 25C

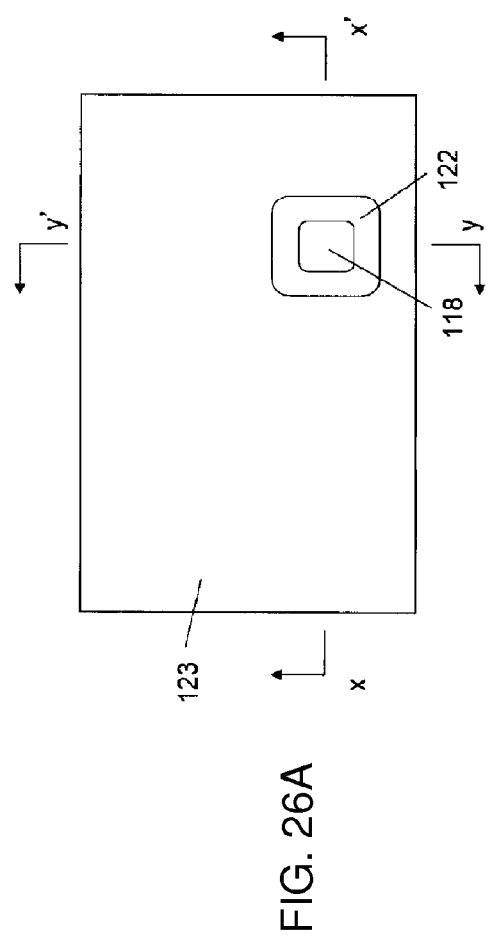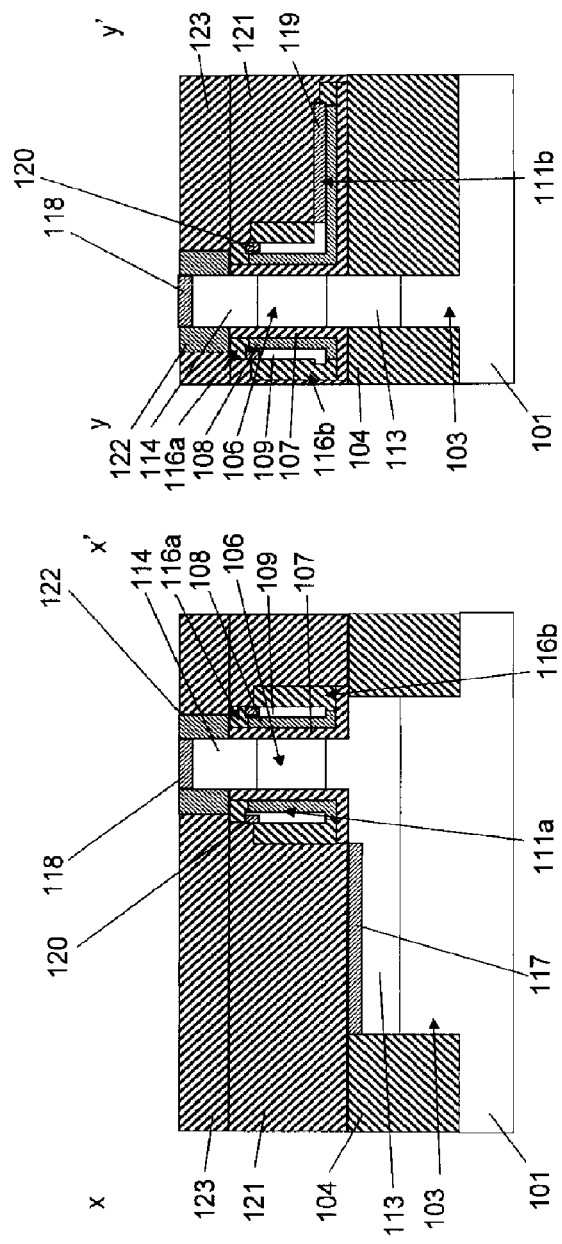
FIG. 26A
FIG. 26B
FIG. 26C

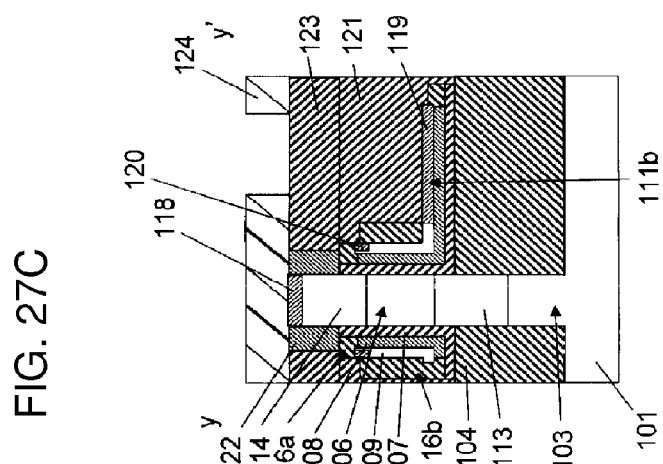
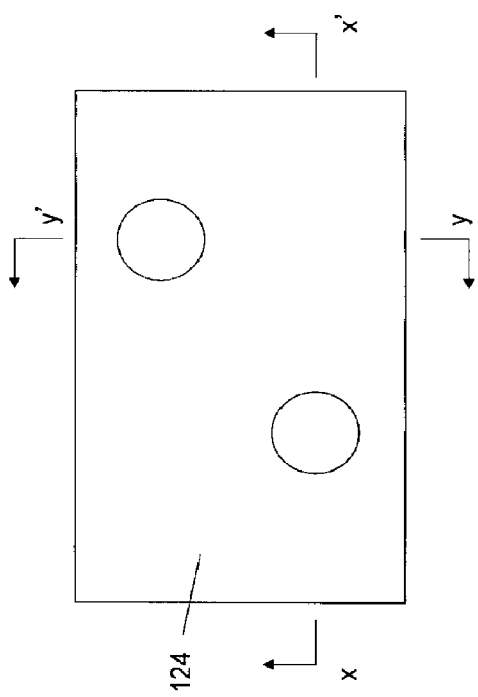
FIG. 27A
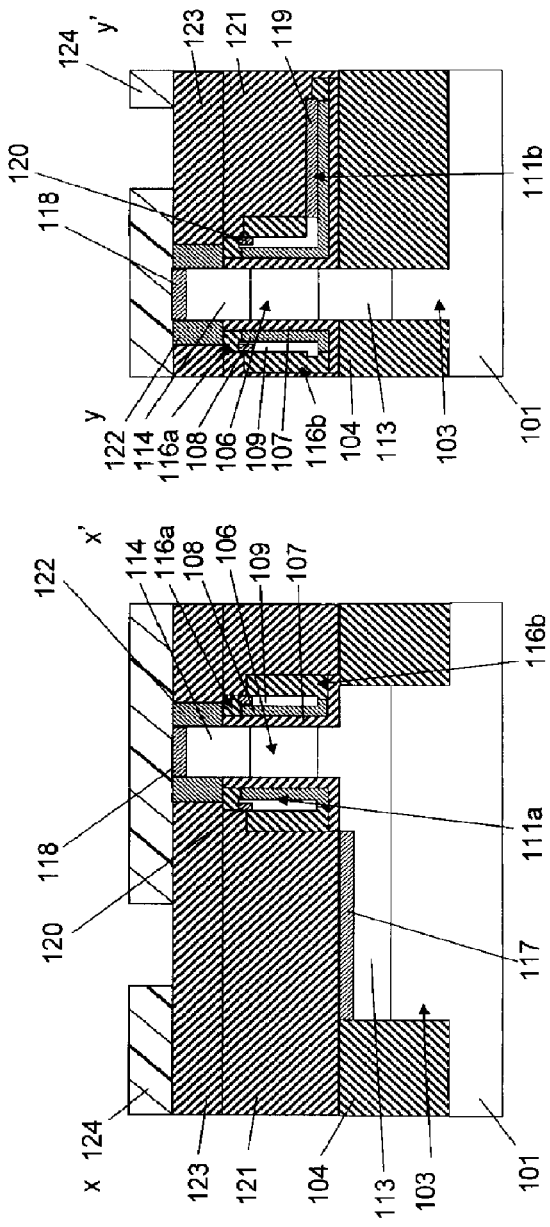
FIG. 27B
FIG. 27C

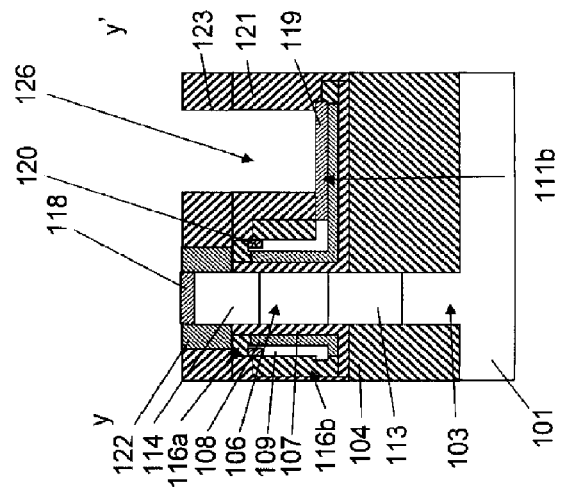
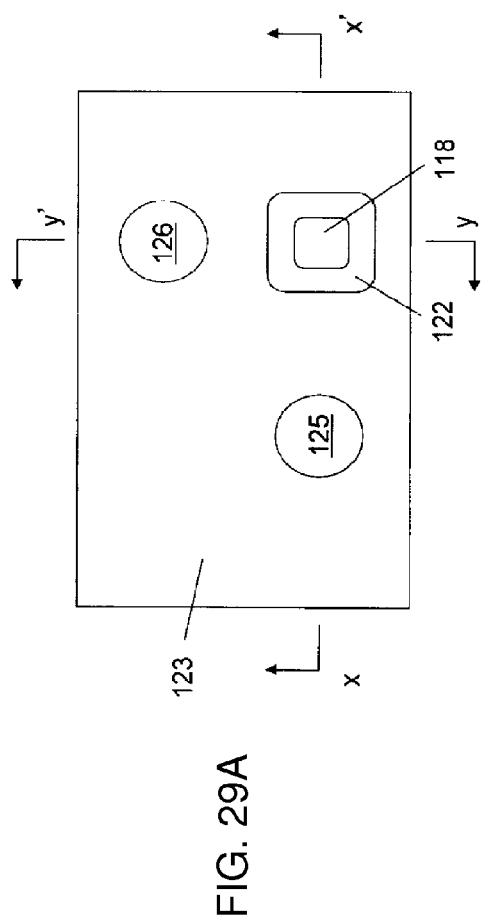
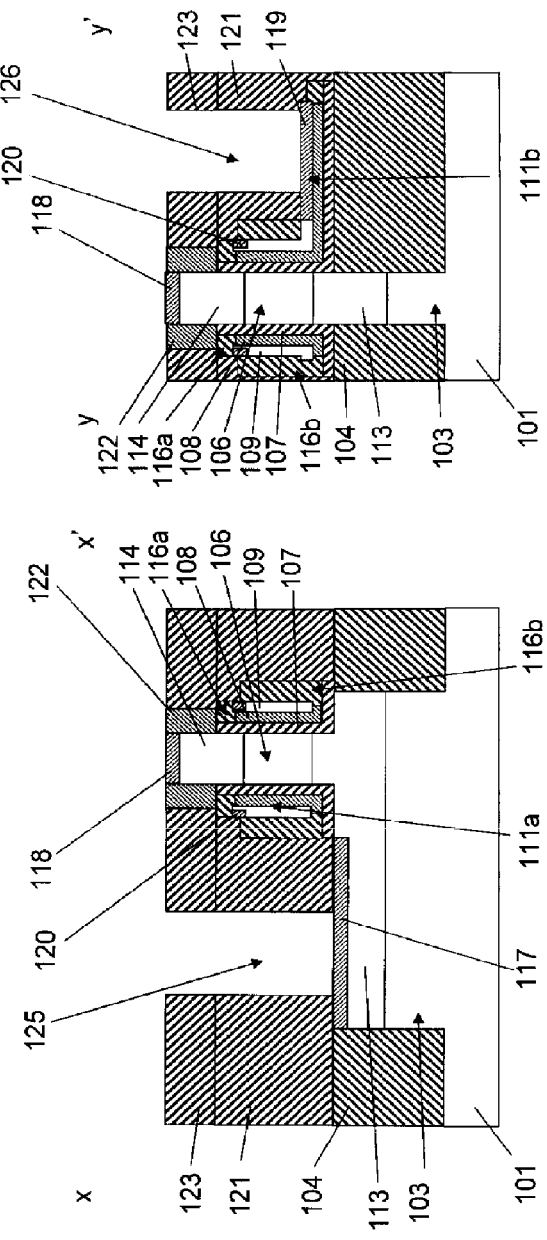

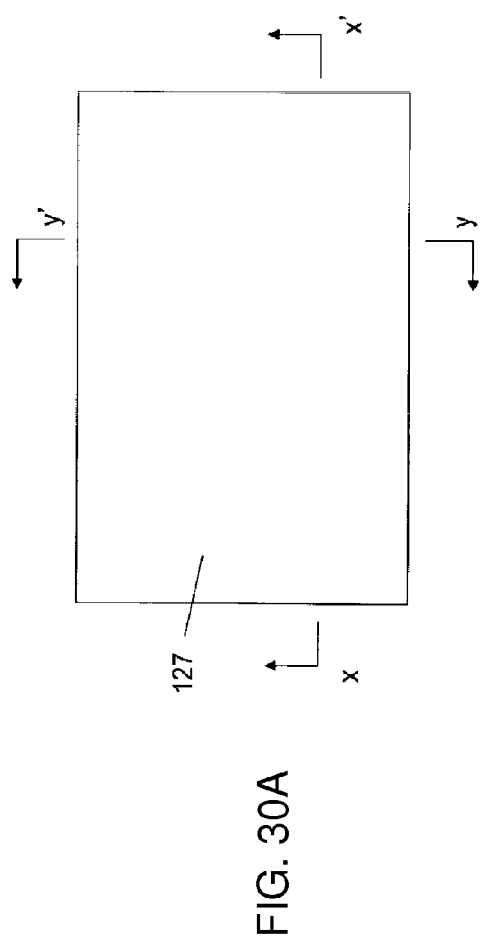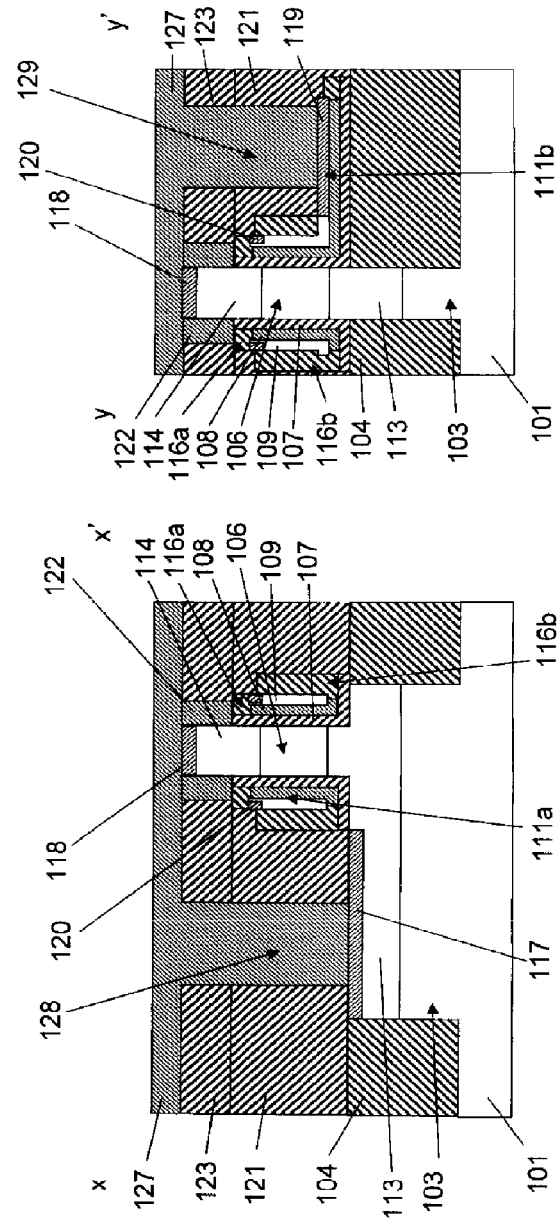
FIG. 30A
FIG. 30B
FIG. 30C

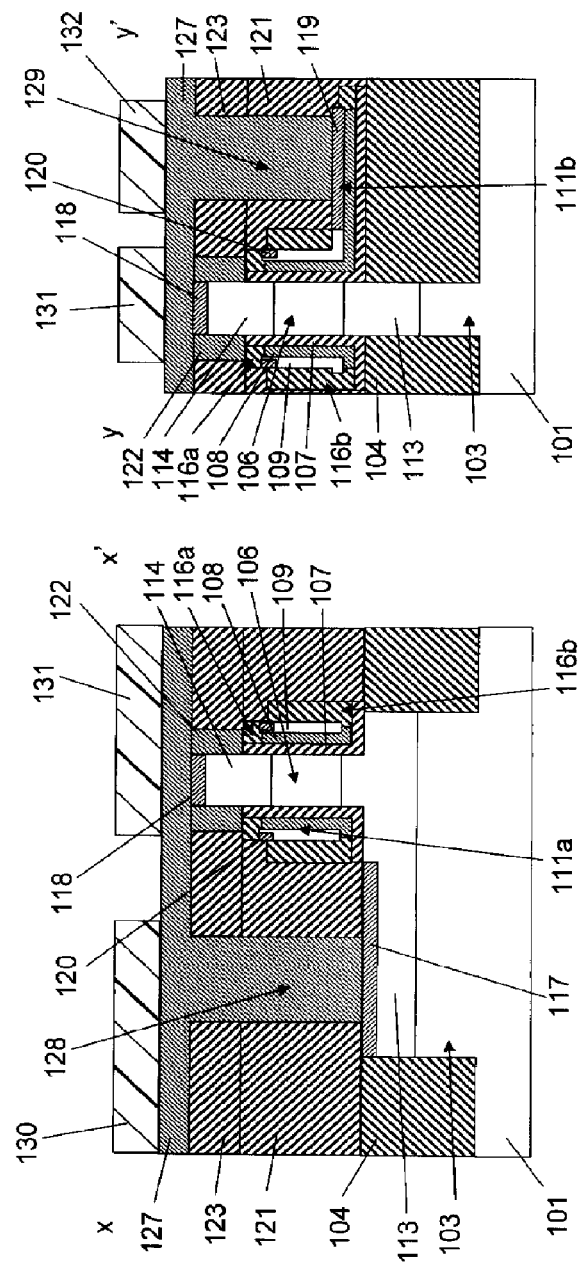

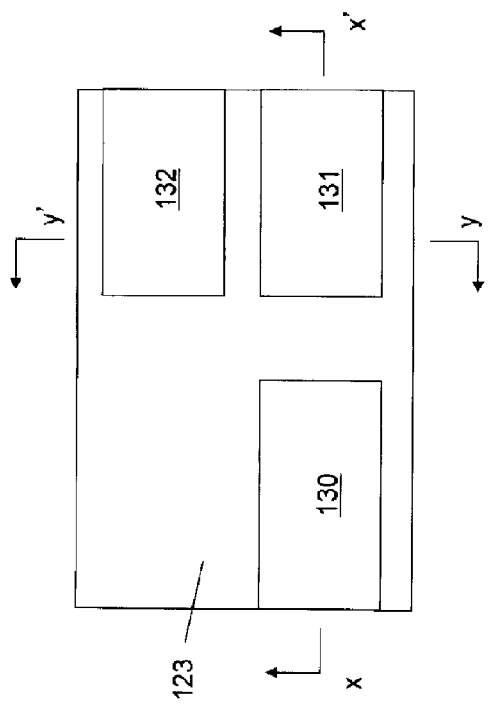
FIG. 32A
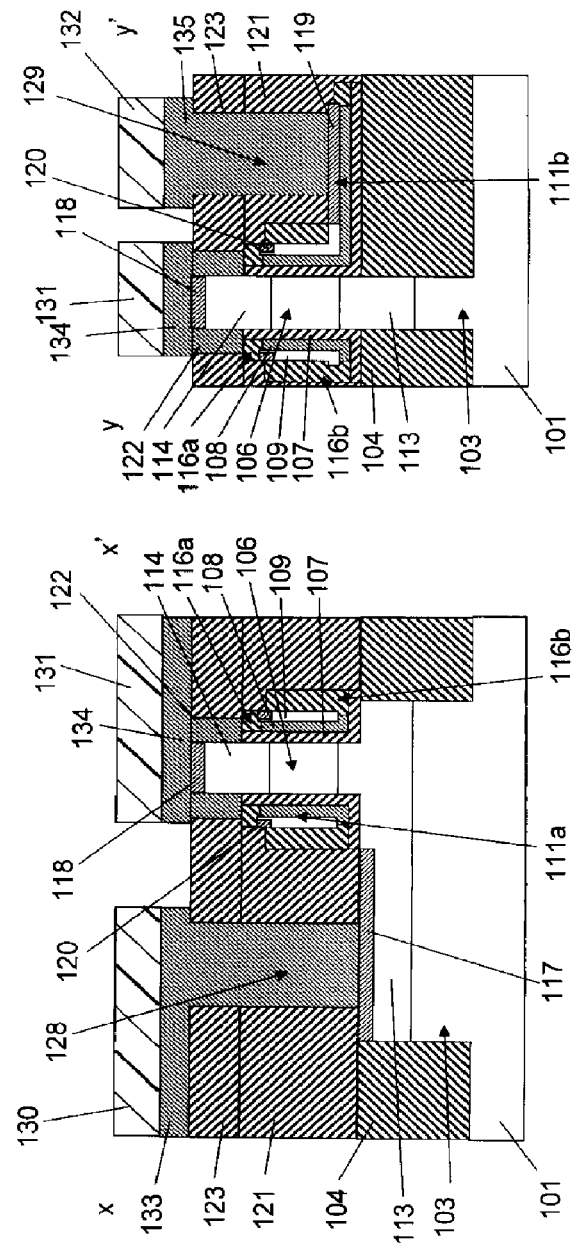
FIG. 32C
FIG. 32B

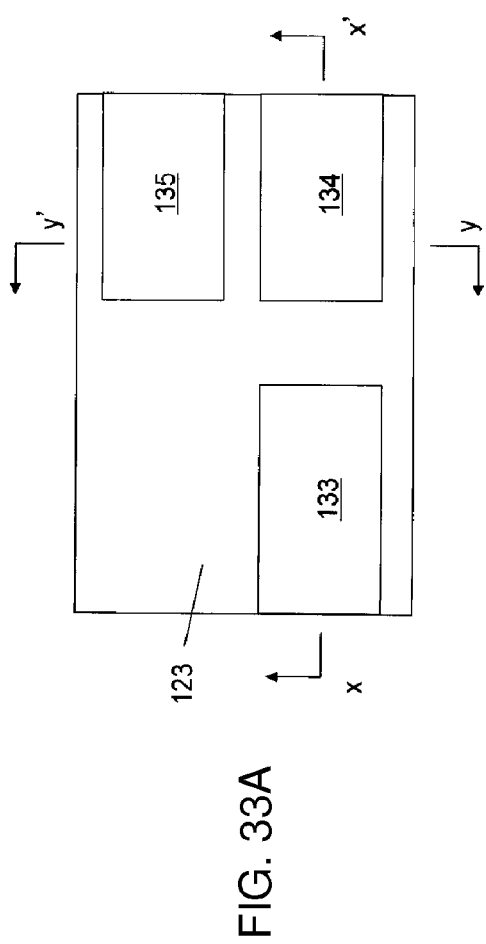
FIG. 33A
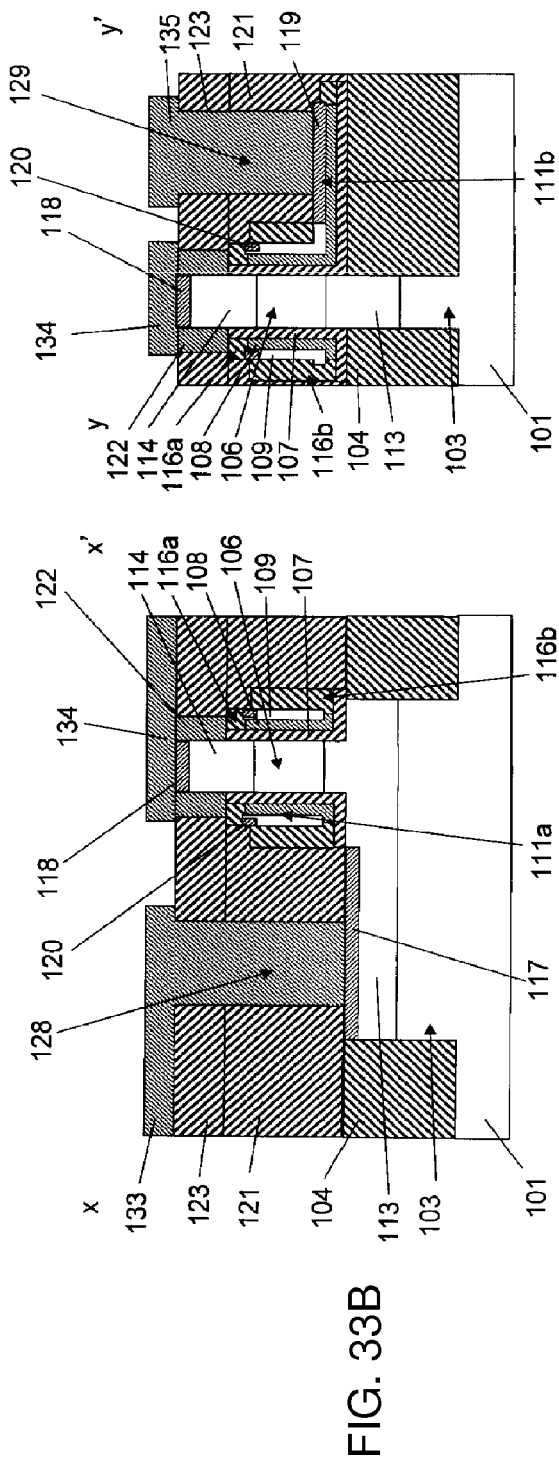
FIG. 33C
FIG. 33B

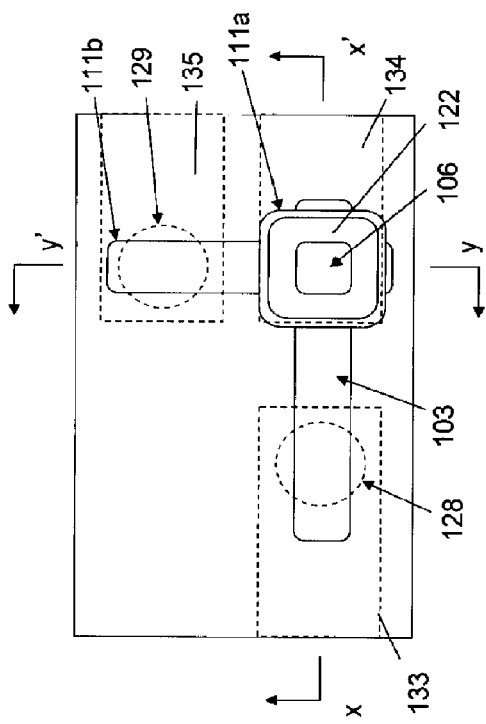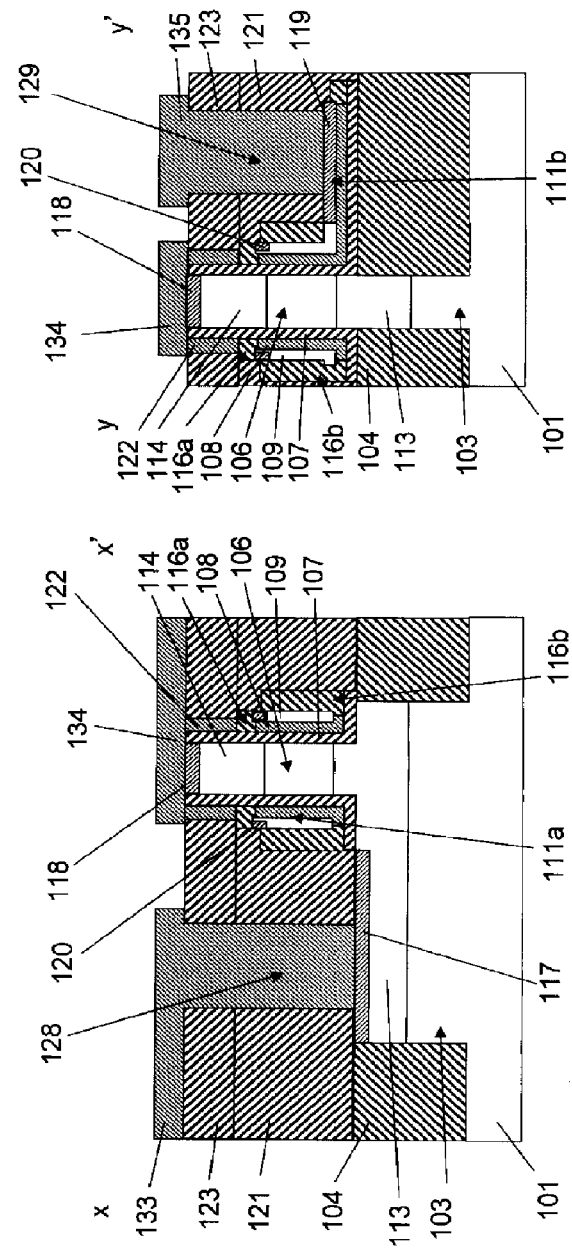
FIG. 34A
FIG. 34B
FIG. 34C

VERTICAL TRANSISTOR WITH SURROUNDING GATE AND WORK-FUNCTION METAL AROUND UPPER SIDEWALL, AND METHOD FOR MANUFACTURING THE SAME

CROSS REFERENCES TO RELATED APPLICATIONS

This application claims the benefit, under 35 U.S.C. §119 (e), of provisional patent application No. 61/756,198, filed on Jan. 24, 2013. The entire content of the prior application is hereby incorporated by reference.

BACKGROUND OF THE INVENTION

1. Field of the Invention

The present invention relates to a method for manufacturing a semiconductor device, and to a semiconductor device.

2. Description of the Related Art

Semiconductor integrated circuits, particularly integrated circuits using MOS transistors, are increasing in integration. With increases in integration, MOS transistors used in the integrated circuits increasingly become finer up to a nano-level. Such finer MOS transistors have the problem of difficulty in suppressing leak currents and difficulty in decreasing areas occupied by circuits in view of the demand for securing necessary amounts of currents. In order to resolve the problem, there are proposed surrounding gate transistors (referred to as "SGT" hereinafter) having a structure in which a source, gate, and drain are disposed perpendicularly to a substrate, and a gate electrode surrounds a pillar-shaped semiconductor layer (for example, refer to Japanese Unexamined Patent Application Publication Nos. 2-71556, 2-188966, and 3-145761).

A conventional SGT manufacturing method includes forming a silicon pillar having a pillar-shaped nitride film hard mask formed thereon, forming a diffusion layer in a lower portion of the silicon pillar, depositing a gate material, planarizing the gate material, etching back the gate material, and forming an insulating film sidewall on sidewalls of the silicon pillar and the nitride film hard mask. Then, a resist pattern for a gate line is formed, the gate material is etched, the nitride film hard mask is removed, and a diffusion layer is formed in an upper portion of the silicon pillar (for example, refer to Japanese Unexamined Patent Application Publication No. 2009-182317). Then, a nitride film sidewall is formed on the sidewall of the silicon pillar, a diffusion layer is formed in an upper portion of the silicon pillar by ion implantation, a nitride film is formed as a contact stopper, an oxide film is formed as an interlayer film, and then contact etching is performed.

Therefore, the sidewall of the upper portion of the silicon pillar is covered with a nitride film sidewall, and a contact is in contact with the upper surface of the silicon pillar. An area of contact between the contact and the upper portion of the silicon pillar decreases as the diameter of the silicon pillar decreases, thereby increasing resistance.

Also, the conventional SGT manufacturing method separately forms a contact hole on the silicon pillar and a contact hole on a planar silicon layer disposed below the silicon pillar because contacts have different depths (for example, refer to Japanese Unexamined Patent Application Publication No. 2012-004244). The separated formation increases the number of steps.

In spite of separated formation, excessive etching of the contact hole on the silicon pillar may cause the contact hole to reach a gate electrode, while insufficient etching may cause insulation between the upper portion of the silicon pillar and the contact.

The contact hole on the planar silicon layer disposed below the silicon pillar is deep and thus hard to fill. Also, a deep contact hole is difficult to form.

Further, a thinner silicon pillar becomes difficult to introduce impurities because of a silicon density of $5 \times 10^{22}/cm^3$.

It is known that in a planar MOS transistor, a sidewall of a LDD region is composed of polycrystalline silicon of the same conductivity type as a low-concentration layer, and surface carriers of the LDD region are induced by a difference in work function, and thus the impedance of the LDD region can be decreased as compared with an oxide film sidewall LDD-type MOS transistor (for example, refer to Japanese Unexamined Patent Application Publication No. 11-297984). It is also known that the polycrystalline silicon sidewall is electrically insulated from a gate electrode. Further it is shown in a drawing that the polycrystalline silicon sidewall is insulated from source and drain through an interlayer insulating film.

SUMMARY OF THE INVENTION

Accordingly, an object of the present invention is to provide a SGT structure having a structure for decreasing the resistance of an upper portion of a pillar-shaped semiconductor layer and a method for manufacturing the SGT.

A method for manufacturing a semiconductor device of the present invention includes a first step of forming a fin-shaped semiconductor layer on a semiconductor substrate, forming a first insulating film around the fin-shaped semiconductor layer, and forming a pillar-shaped semiconductor layer in an upper portion of the fin-shaped semiconductor layer; a second step of forming a gate insulating film around the pillar-shaped semiconductor layer, forming a gate electrode around the gate insulating film, and forming a gate line connected to the gate electrode; a third step of forming a first first-conductivity-type diffusion layer in an upper portion of the pillar-shaped semiconductor layer and forming a second first-conductivity-type diffusion layer in a lower portion of the pillar-shaped semiconductor layer and in an upper portion of the fin-shaped semiconductor layer; and a fourth step of depositing a first interlayer insulating film, planarizing and etching-back the first interlayer insulating film to expose an upper portion of the pillar-shaped semiconductor layer, depositing a first metal after exposing the upper portion of the pillar-shaped semiconductor layer, and etching the metal to form a first sidewall composed of the metal around the sidewall of the upper portion of the pillar-shaped semiconductor layer.

The method further includes, after the fourth step, a fifth step of depositing a second interlayer insulating film, planarizing and etching-back the second interlayer insulating film to expose an upper portion of the pillar-shaped semiconductor layer, forming a fifth resist for forming a first contact, etching the second interlayer insulating film and the first interlayer insulating film to form a contact hole, depositing a second metal to form a first contact on the second first-conductivity-type diffusion layer, forming a sixth resist for forming a metal line, and forming a first metal line by etching.

A semiconductor device of the present invention includes a fin-shaped semiconductor layer formed on a semiconductor substrate, a pillar-shaped semiconductor layer formed on the fin-shaped semiconductor layer, a gate insulating film formed around the pillar-shaped semiconductor layer, a gate electrode formed around the gate insulating film, a gate line connected to the gate electrode, a first first-conductivity-type diffusion layer formed in an upper portion of the pillar-shaped semiconductor layer, a second first-conductivity-type diffusion layer formed in a lower portion of the pillar-shaped semiconductor layer and in an upper portion of the fin-shaped semiconductor layer, and a first sidewall composed of a first metal and formed around the sidewall of an upper portion of the pillar-shaped semiconductor layer.

The semiconductor device of the present invention further includes a first metal line formed on an upper portion of the pillar-shaped semiconductor layer and on the first sidewall.

The semiconductor device of the present invention is characterized in that the semiconductor layers are silicon layers.

The semiconductor device of the present invention is characterized in that the first-conductivity-type diffusion layers are an n-type, and the metal of the first sidewall has a work function between 4.0 eV and 4.2 eV.

The semiconductor device of the present invention is characterized in that the first-conductivity-type diffusion layers are a p-type, and the metal of the first sidewall has a work function between 5.0 eV and 5.2 eV.

The semiconductor device of the present invention further includes a first contact formed on the second first-conductivity-type diffusion layer, wherein the depth of the first contact is equal to or smaller than the height of the pillar-shaped semiconductor layer.

The semiconductor device of the present invention is characterized in that the width of the pillar-shaped semiconductor layer is equal to the width of the fin-shaped semiconductor layer.

The present invention can provide a SGT structure having a structure for decreasing resistance of an upper portion of a pillar-shaped semiconductor layer and a method for manufacturing the SGT.

Since a metal is in contact with the periphery of the sidewall of an upper portion of the pillar-shaped semiconductor layer, an area of contact between the metal and the upper portion of the pillar-shaped semiconductor layer is increased, and thus resistance of the upper portion of the pillar-shaped semiconductor layer can be decreased.

Also, when the semiconductor layer is a silicon layer, surface carriers are induced by a difference in work function between the metal of the first sidewall which has a work function between 4.0 eV and 4.2 eV and n-type silicon which has a work function close to 4.05 eV, and thus the resistance of an upper portion of the pillar-shaped silicon layer can be decreased. For example, when the pillar-shaped silicon layer has a low impurity concentration, a transistor composed of the first sidewall and the pillar-shaped silicon layer is turned on with a voltage of 0 V applied to the first sidewall through a metal line.

In addition, when the semiconductor layer is a silicon layer, surface carriers are induced by a difference in work function between the metal of the first sidewall which has a work function between 5.0 eV and 5.2 eV and p-type silicon which has a work function close to 5.15 eV, and thus the resistance of an upper portion of the pillar-shaped silicon layer can be decreased. For example, when the pillar-shaped silicon layer has a low impurity concentration, a transistor composed of the first sidewall and the pillar-shaped silicon layer is turned on with a voltage of 0 V applied to the first sidewall through a metal line Further, since the first metal line is brought into direct contact with the upper portion of the pillar-shaped semiconductor layer, a contact hole for the first contact can be made shallow, thereby facilitating the formation of the contact hole and filling the contact hole with a metal.

Further, the fin-shaped semiconductor layer, the first insulating film, and the pillar-shaped semiconductor layer can be easily formed because they are formed based on a conventional method for manufacturing FIN FET.

BRIEF DESCRIPTION OF THE DRAWINGS

FIG. 1($a$) is a plan view of a semiconductor device according to the present invention. FIG. 1($b$) is a cross-sectional view taken along line X-X' in FIG. 1($a$). FIG. 1($c$) is a cross-sectional view taken along line Y-Y' in FIG. 1($a$).

FIG. 2($b$) is a cross-sectional view taken along line X-X' in FIG. 2($a$). FIG. 2($c$) is a cross-sectional view taken along line Y-Y' in FIG. 2($a$).

FIG. 3($a$) is a plan view relating to a method for manufacturing a semiconductor device according to the present invention. FIG. 3($b$) is a cross-sectional view taken along line X-X' in FIG. 3($a$). FIG. 3($c$) is a cross-sectional view taken along line Y-Y' in FIG. 3($a$).

FIG. 4($b$) is a cross-sectional view taken along line X-X' in FIG. 4($a$). FIG. 4($c$) is a cross-sectional view taken along line Y-Y' in FIG. 4($a$).

FIG. 5($a$) is a plan view relating to a method for manufacturing a semiconductor device according to the present invention. FIG. 5($b$) is a cross-sectional view taken along line X-X' in FIG. 5($a$). FIG. 5($c$) is a cross-sectional view taken along line Y-Y' in FIG. 5($a$).

FIG. 6($a$) is a plan view relating to a method for manufacturing a semiconductor device according to the present invention. FIG. 6($b$) is a cross-sectional view taken along line X-X' in FIG. 6($a$). FIG. 6($c$) is a cross-sectional view taken along line Y-Y' in FIG. 6($a$).

FIG. 7($a$) is a plan view relating to a method for manufacturing a semiconductor device according to the present invention. FIG. 7($b$) is a cross-sectional view taken along line X-X' in FIG. 7($a$). FIG. 7($c$) is a cross-sectional view taken along line Y-Y' in FIG. 7($a$).

FIG. 8($b$) is a cross-sectional view taken along line X-X' in FIG. 8($a$). FIG. 8($c$) is a cross-sectional view taken along line Y-Y' in FIG. 8($a$).

FIG. 9($b$) is a cross-sectional view taken along line X-X' in FIG. 9($a$). FIG. 9($c$) is a cross-sectional view taken along line Y-Y' in FIG. 9($a$).

FIG. 10($b$) is a cross-sectional view taken along line X-X' in FIG. 10($a$). FIG. 10($c$) is a cross-sectional view taken along line Y-Y' in FIG. 10($a$).

FIG. 11($b$) is a cross-sectional view taken along line X-X' in FIG. 11($a$). FIG. 11($c$) is a cross-sectional view taken along line Y-Y' in FIG. 11($a$).

FIG. 12($b$) is a cross-sectional view taken along line X-X' in FIG. 12($a$). FIG. 12($c$) is a cross-sectional view taken along line Y-Y' in FIG. 12($a$).

FIG. 13(a) is a plan view relating to a method for manufacturing a semiconductor device according to the present invention. FIG. 13(b) is a cross-sectional view taken along line X-X' in FIG. 13(a). FIG. 13(c) is a cross-sectional view taken along line Y-Y' in FIG. 13(a).

FIG. 16(a) is a plan view relating to a method for manufacturing a semiconductor device according to the present invention. FIG. 16(b) is a cross-sectional view taken along line X-X' in FIG. 16(a). FIG. 16(c) is a cross-sectional view taken along line Y-Y' in FIG. 16(a).

FIG. 17(a) is a plan view relating to a method for manufacturing a semiconductor device according to the present invention. FIG. 17(b) is a cross-sectional view taken along line X-X' in FIG. 17(a). FIG. 17(c) is a cross-sectional view taken along line Y-Y' in FIG. 17(a).

FIG. 18(a) is a plan view relating to a method for manufacturing a semiconductor device according to the present invention. FIG. 18(b) is a cross-sectional view taken along line X-X' in FIG. 18(a). FIG. 18(c) is a cross-sectional view taken along line Y-Y' in FIG. 18(a).

FIG. 22(a) is a plan view relating to a method for manufacturing a semiconductor device according to the present invention. FIG. 22(b) is a cross-sectional view taken along line X-X' in FIG. 22(a). FIG. 22(c) is a cross-sectional view taken along line Y-Y' in FIG. 22(a).

FIG. 23(a) is a plan view relating to a method for manufacturing a semiconductor device according to the present invention. FIG. 23(b) is a cross-sectional view taken along line X-X' in FIG. 23(a). FIG. 23(c) is a cross-sectional view taken along line Y-Y' in FIG. 23(a).

FIG. 24(a) is a plan view relating to a method for manufacturing a semiconductor device according to the present invention. FIG. 24(b) is a cross-sectional view taken along line X-X' in FIG. 24(a). FIG. 24(c) is a cross-sectional view taken along line Y-Y' in FIG. 24(a).

FIG. 25(a) is a plan view relating to a method for manufacturing a semiconductor device according to the present invention. FIG. 25(b) is a cross-sectional view taken along line X-X' in FIG. 25(a). FIG. 25(c) is a cross-sectional view taken along line Y-Y' in FIG. 25(a).

FIG. 26(a) is a plan view relating to a method for manufacturing a semiconductor device according to the present invention. FIG. 26(b) is a cross-sectional view taken along line X-X' in FIG. 26(a). FIG. 26(c) is a cross-sectional view taken along line Y-Y' in FIG. 26(a).

FIG. 27(a) is a plan view relating to a method for manufacturing a semiconductor device according to the present invention. FIG. 27(b) is a cross-sectional view taken along line X-X' in FIG. 27(a). FIG. 27(c) is a cross-sectional view taken along line Y-Y' in FIG. 27(a).

FIG. 29(a) is a plan view relating to a method for manufacturing a semiconductor device according to the present invention. FIG. 29(b) is a cross-sectional view taken along line X-X' in FIG. 29(a). FIG. 29(c) is a cross-sectional view taken along line Y-Y' in FIG. 29(a).

FIG. 30(a) is a plan view relating to a method for manufacturing a semiconductor device according to the present invention. FIG. 30(b) is a cross-sectional view taken along line X-X' in FIG. 30(a). FIG. 30(c) is a cross-sectional view taken along line Y-Y' in FIG. 30(a).

FIG. 31(a) is a plan view relating to a method for manufacturing a semiconductor device according to the present invention. FIG. 31(b) is a cross-sectional view taken along line X-X' in FIG. 31(a). FIG. 31(c) is a cross-sectional view taken along line Y-Y' in FIG. 31(a).

FIG. 32(a) is a plan view relating to a method for manufacturing a semiconductor device according to the present invention. FIG. 32(b) is a cross-sectional view taken along line X-X' in FIG. 32(a). FIG. 32(c) is a cross-sectional view taken along line Y-Y' in FIG. 32(a).

FIG. 33(a) is a plan view relating to a method for manufacturing a semiconductor device according to the present invention. FIG. 33(b) is a cross-sectional view taken along line X-X' in FIG. 33(a). FIG. 33(c) is a cross-sectional view taken along line Y-Y' in FIG. 33(a).

FIG. 34(a) is a plan view of a semiconductor device according to the present invention. FIG. 34(b) is a cross-sectional view taken along line X-X' in FIG. 34(a). FIG. 34(c) is a cross-sectional view taken along line Y-Y' in FIG. 34(a).

DESCRIPTION OF THE INVENTION

Manufacturing steps for forming a SGT structure according to an embodiment of the present invention are described below with reference to FIG. 2 to FIG. 33.

Figure 2A:
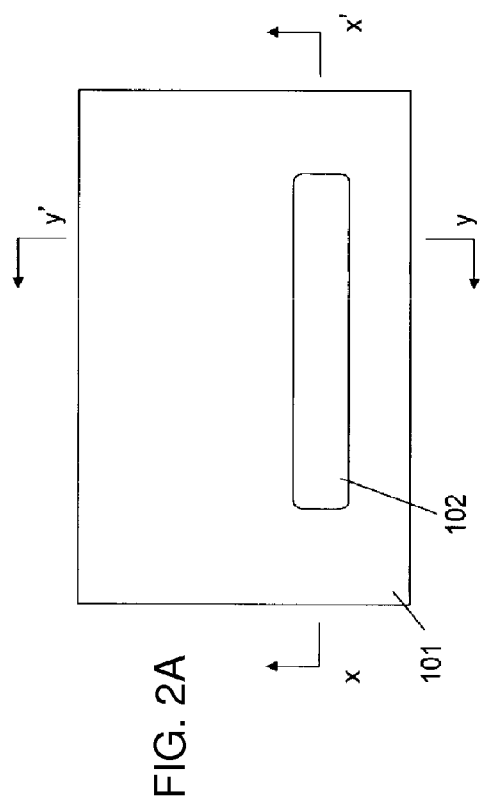
FIG. 2($a$) is a plan view relating to a method for manufacturing a semiconductor device according to the present invention.
Figure 2C:
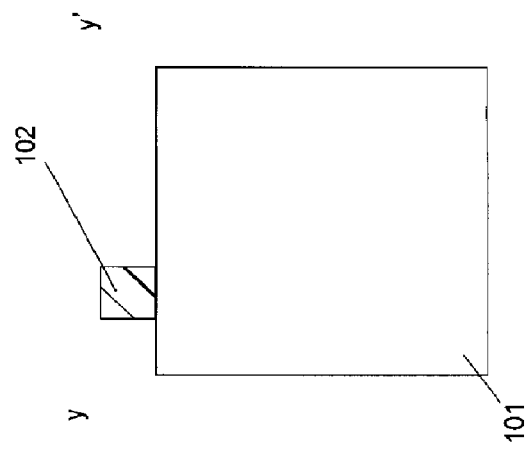
Figure 2B:
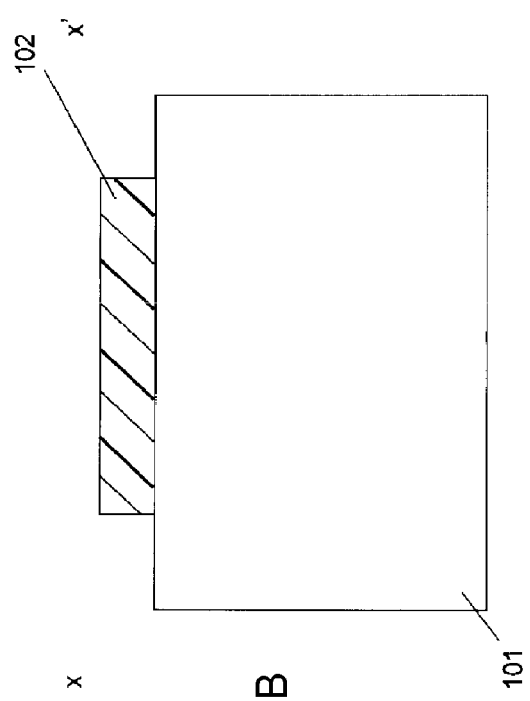

First, described is a first step forming a fin-shaped semiconductor layer on a semiconductor substrate, forming a first insulating film around the fin-shaped semiconductor layer, and forming a pillar-shaped semiconductor layer on the fin-shaped semiconductor layer. As shown in FIG. 2, a first resist 102 for forming a fin-shaped semiconductor layer is formed on a semiconductor substrate 101.

As shown in FIG. 3, the fin-shaped semiconductor layer 103 is formed by etching the semiconductor substrate 101. Although, in this case, the fin-shaped semiconductor layer is formed by using the resist as a mask, a hard mask such as an oxide film or a nitride film may be used.

Figure 4A:
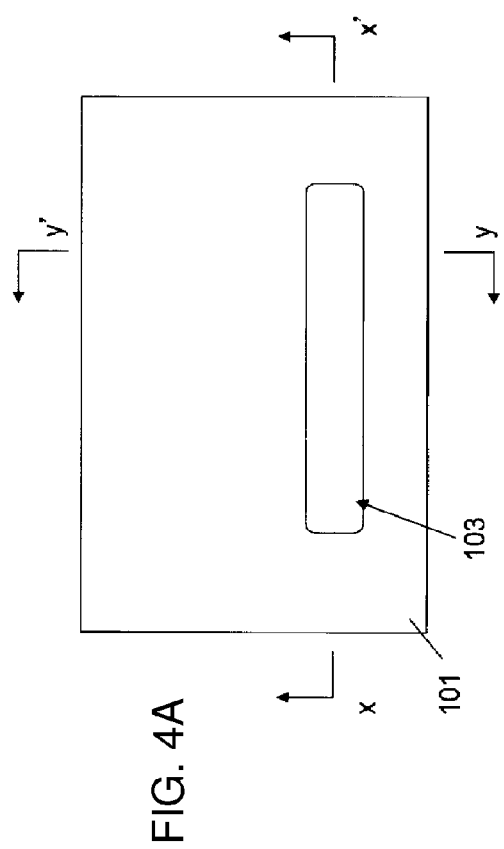
FIG. 4($a$) is a plan view relating to a method for manufacturing a semiconductor device according to the present invention.
Figure 4C:
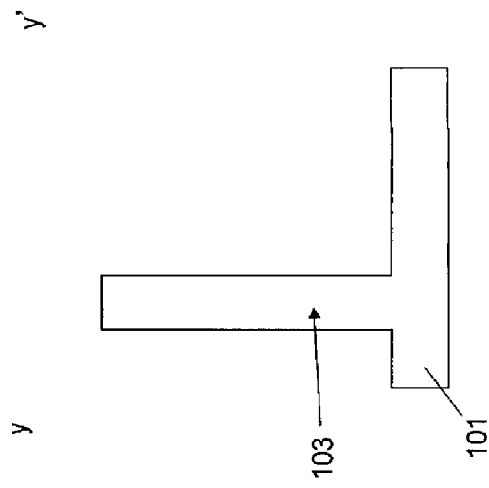
Figure 4B:
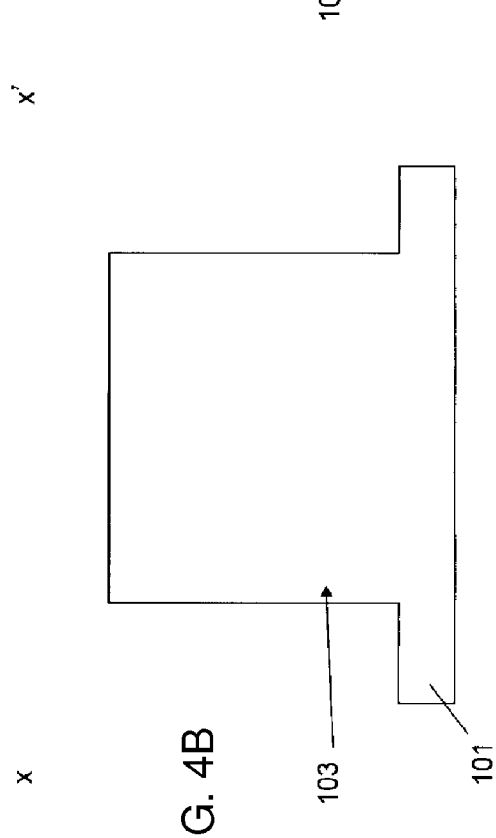

As shown in FIG. 4, the first resist 102 is removed.

As shown in FIG. 5, a first insulating film 104 is deposited around the fin-shaped semiconductor layer 103. An oxide film by high-density plasma or an oxide film by low-pressure chemical vapor deposition may be used as the first insulating film.

As shown in FIG. 6, the first insulating film 104 is etched back to expose an upper portion of the fin-shaped semiconductor layer 103. The procedures up to this are the same as in a conventional method for producing a fin-shaped semiconductor layer.

As shown in FIG. 7, a second resist 105 is formed to be perpendicular to the fin-shaped semiconductor layer 103. A portion where the fin-shaped semiconductor layer 103 is perpendicular to the resist 105 is a portion serving as a pillar-shaped semiconductor layer. Since a linear resist can be used, the resist is unlikely to fall after patterning, thereby providing a stable process.

Figure 8A:
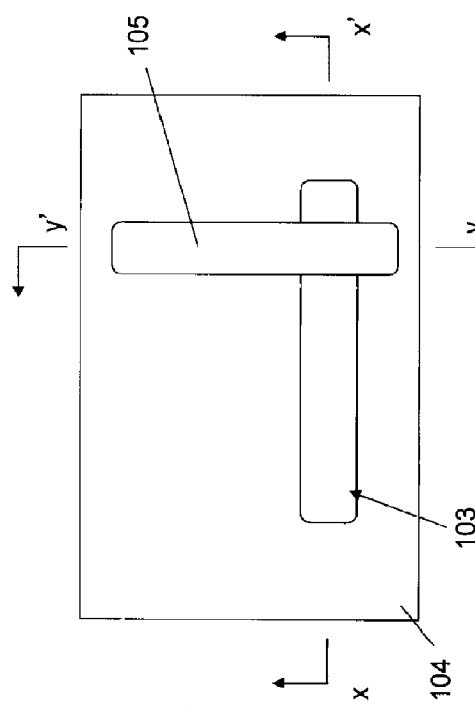
FIG. 8($a$) is a plan view relating to a method for manufacturing a semiconductor device according to the present invention.
Figure 8C:
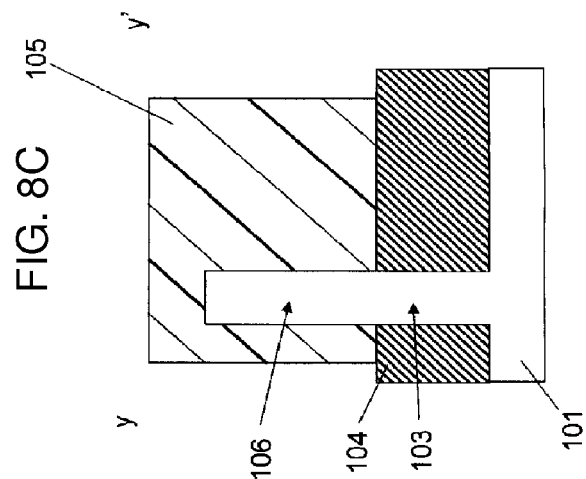
Figure 8B:
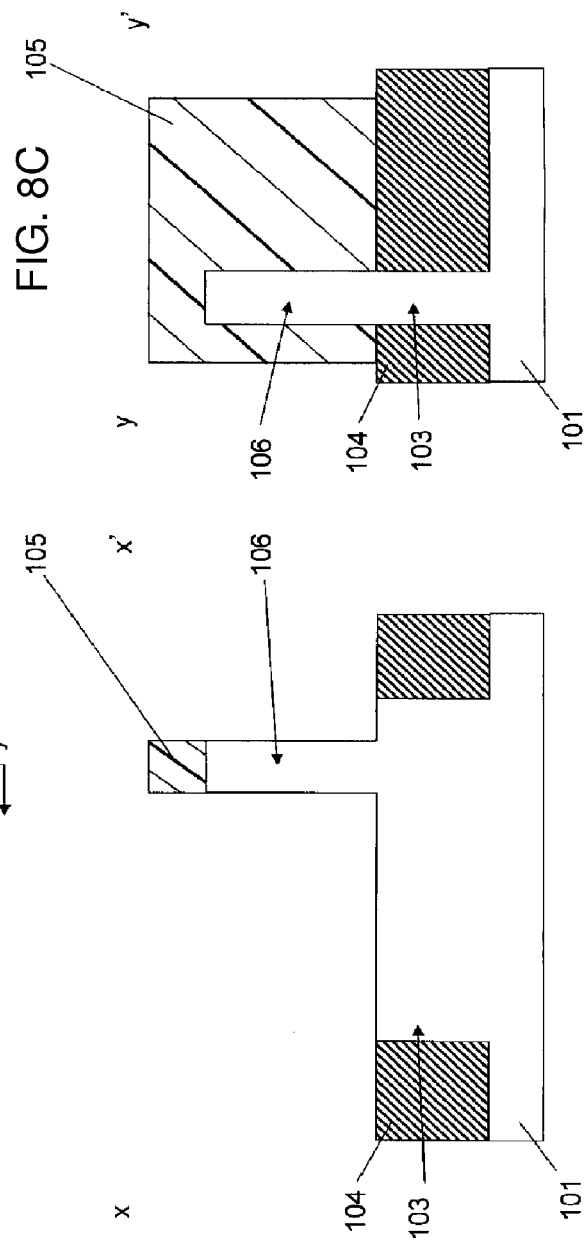

As shown in FIG. 8, the fin-shaped semiconductor layer 103 is etched. A portion where the fin-shaped semiconductor layer 103 is perpendicular to the second resist 105 becomes a portion serving as the pillar-shaped semiconductor layer 106. Therefore, the width of the pillar-shaped semiconductor layer 106 is equal to the width of the fin-shaped semiconductor layer. The resulting structure includes the pillar-shaped semiconductor layer 106 formed on the fin-shaped semiconductor layer 103, and the first insulating film 104 formed around the fin-shaped semiconductor layer 103. The fin-shaped semiconductor layer, the first insulating film, and the pillar-shaped semiconductor layer can be easily formed because they are formed based on a conventional method for manufacturing FINFET.

Figure 9A:
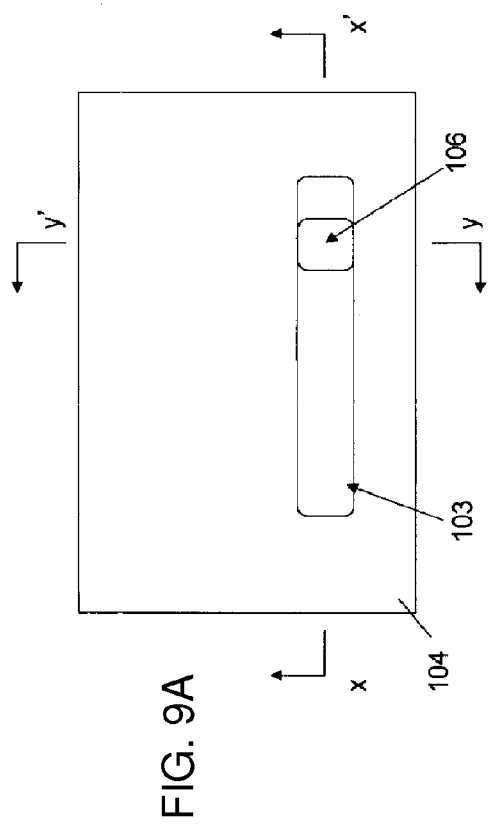
FIG. 9($a$) is a plan view relating to a method for manufacturing a semiconductor device according to the present invention.
Figure 9B:
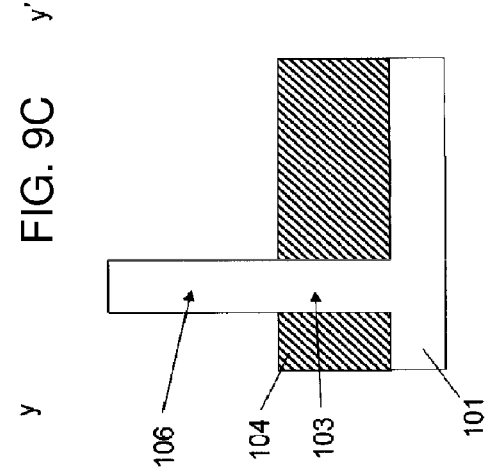
Figure 9C:
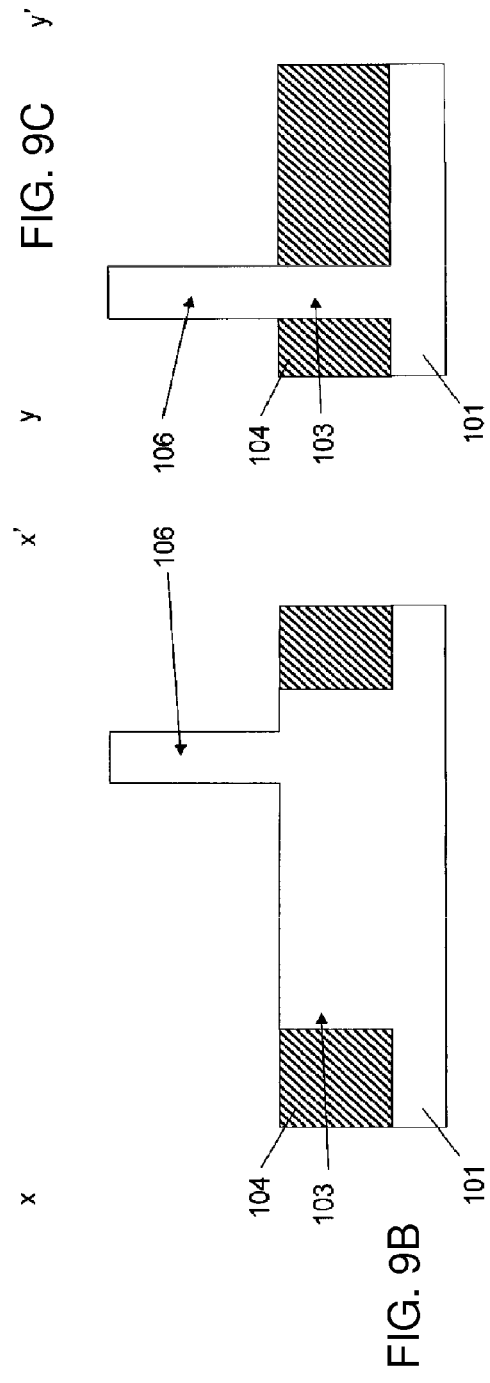

As shown in FIG. 9, the second resist 105 is removed.

The above shows the first step of forming the fin-shaped semiconductor layer on the semiconductor substrate, forming the first insulating film around the fin-shaped semiconductor layer, and forming the pillar-shaped semiconductor layer on the fin-shaped semiconductor layer.

Next, a second step of forming a gate insulating film around the pillar-shaped semiconductor layer, forming a gate electrode around the gate insulating film, and forming a gate line connected to the gate electrode is described.

Figure 10A:
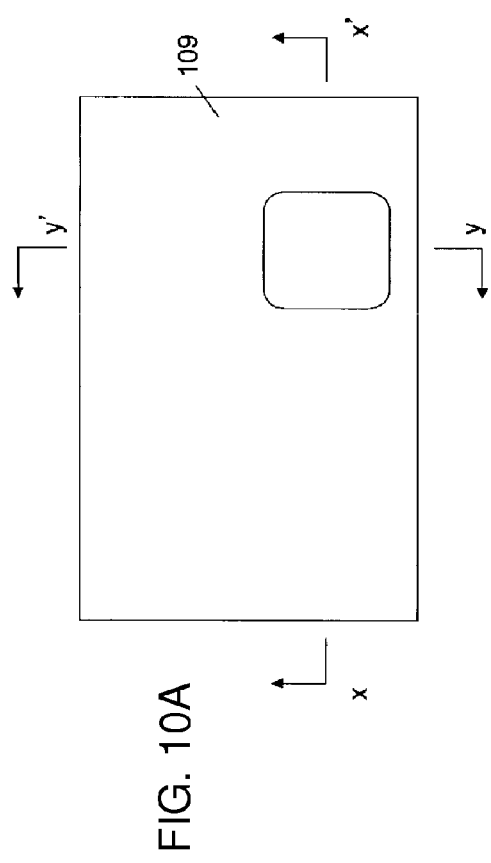
FIG. 10($a$) is a plan view relating to a method for manufacturing a semiconductor device according to the present invention.
Figure 10C:
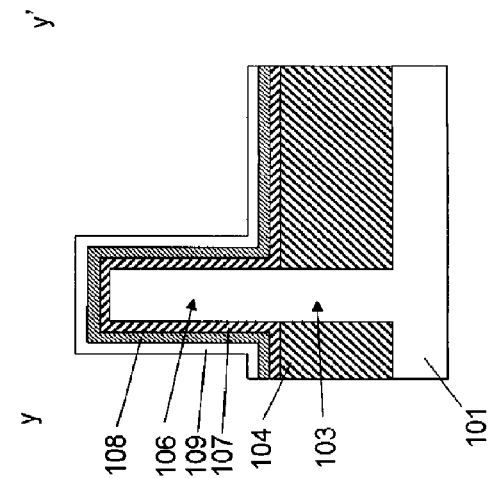
Figure 10B:
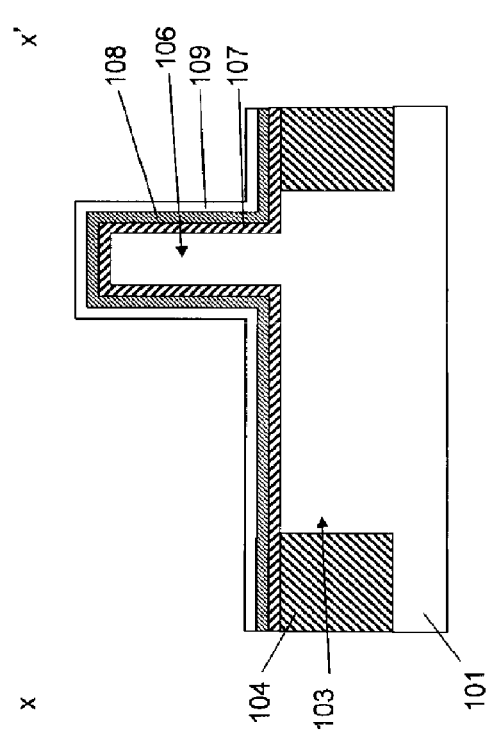

As shown in FIG. 10, a gate insulating film 107 is formed around the pillar-shaped semiconductor layer 106, and a metal film 108 and a polysilicon film 109 are formed around the gate insulating film 107.

In this case, the thin polysilicon film 109 is used. Therefore, voids can be prevented from being formed in the polysilicon film.

The metal film 108 may be composed of any metal as long as it is used in a semiconductor process and determines a threshold voltage of a transistor, and, for example, titanium nitride can be used.

The gate insulating film 107 may be any film as long as it is used in a semiconductor process, and, for example, an oxide film, an oxynitride film, or a high-dielectric film can be used.

Figure 11A:
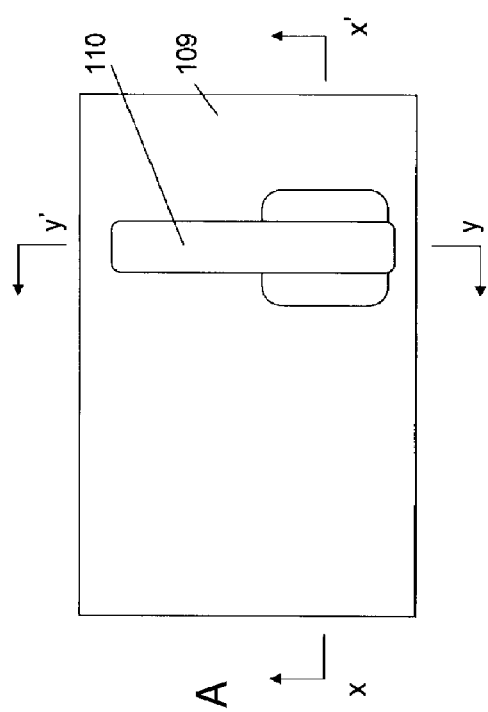
FIG. 11($a$) is a plan view relating to a method for manufacturing a semiconductor device according to the present invention.
Figure 11C:
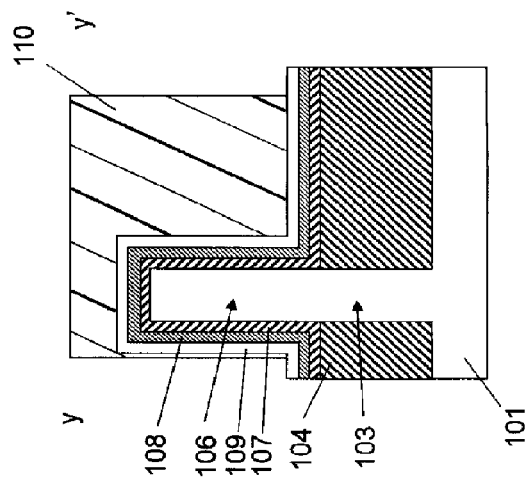
Figure 11B:
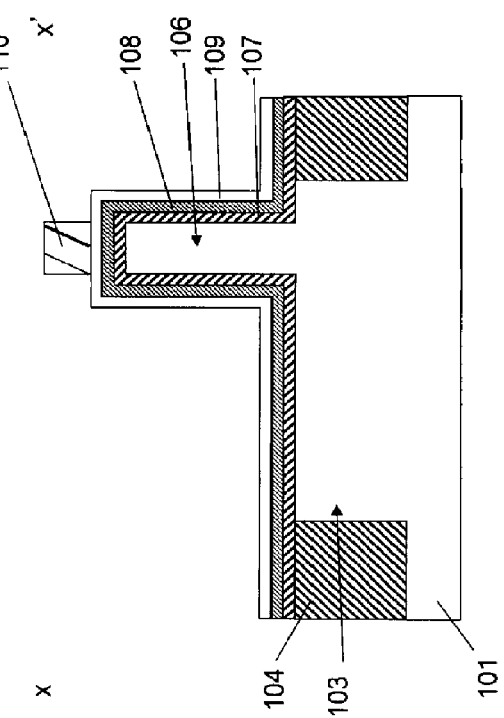

As shown in FIG. 11, a third resist 110 for forming a gate line 111b is formed. In this embodiment, the resist is described as being higher than the pillar-shaped semiconductor layer. The thinner the gate line is, the more easily the polysilicon on an upper portion of the pillar-shaped semiconductor layer is exposed. The height of the resist may be lower than that of the pillar-shaped semiconductor layer.

Figure 12A:
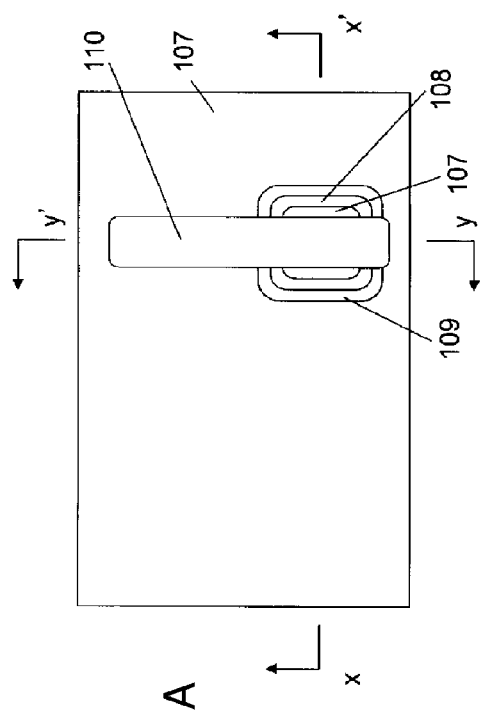
FIG. 12($a$) is a plan view relating to a method for manufacturing a semiconductor device according to the present invention.
Figure 12C:
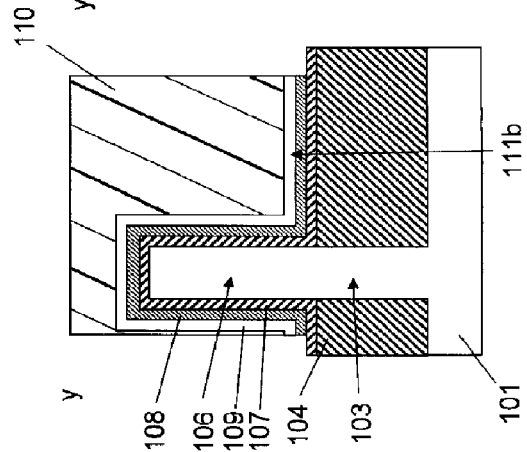
Figure 12B:
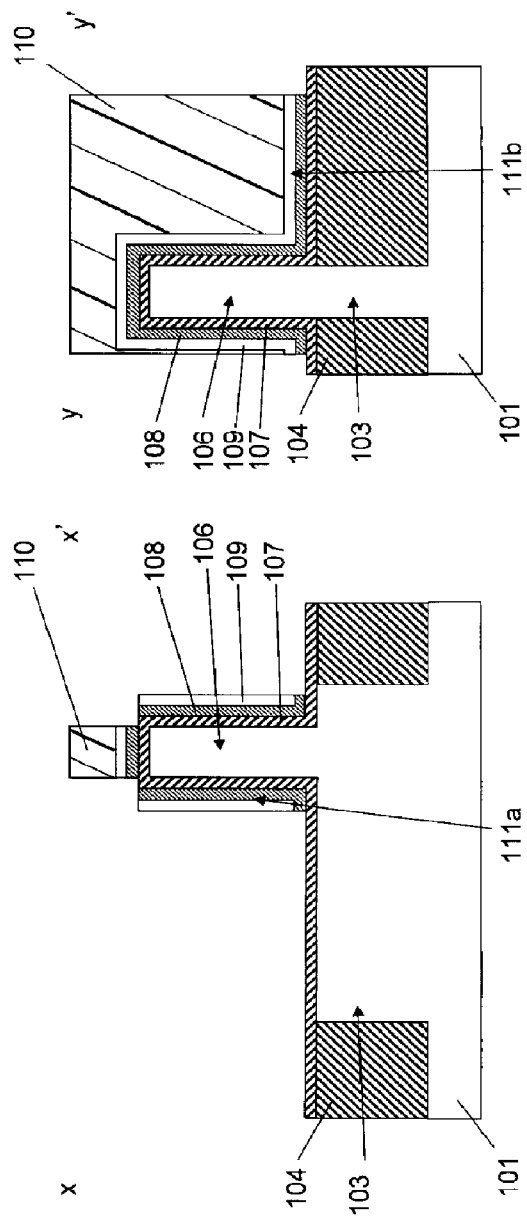

As shown in FIG. 12, the polysilicon film 109 and the metal film 108 are etched. As a result, a gate electrode 111a and a gate line 111b are formed. In this case, when the resist on an upper portion of the pillar-shaped semiconductor layer is thin or the polysilicon on an upper portion of the pillar-shaped semi-conductor layer is exposed, the upper portion of the pillar-shaped semiconductor layer may be etched. In this case, when the pillar-shaped semiconductor layer is formed, the height is preferably determined to be the sum of a desired height of the pillar-shaped semiconductor layer and a height subsequently removed by etching for the gate line. Therefore, the manufacturing process of the present invention becomes a self-alignment process.

As shown in FIG. 13, the third resist 110 is removed.

Figure 14C:
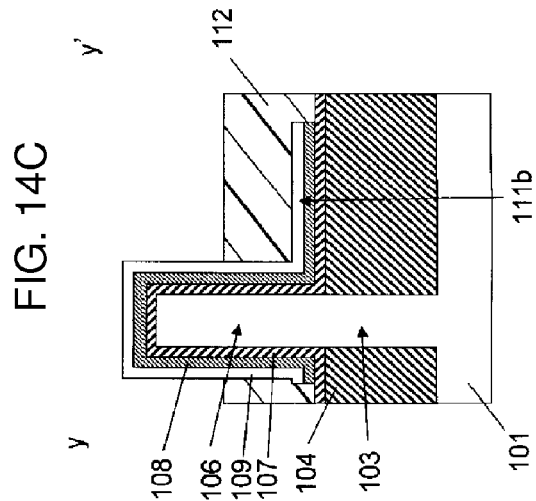
FIG. 14(c) is a cross-sectional view taken along line Y-Y' in FIG. 14(a).
Figure 14A:
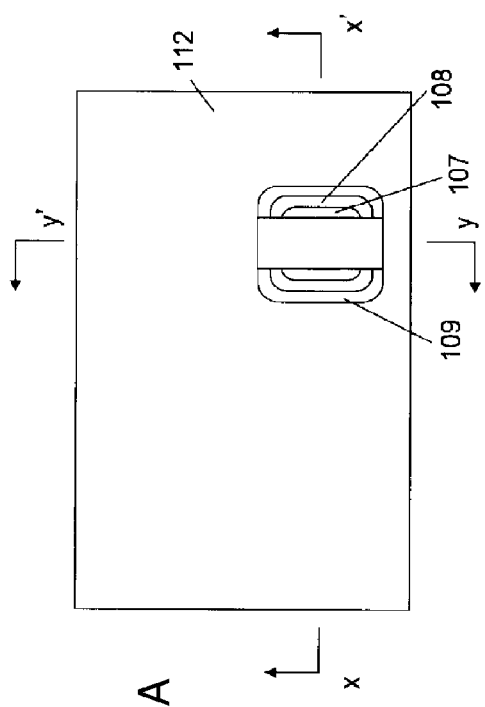
FIG. 14(a) is a plan view relating to a method for manufacturing a semiconductor device according to the present invention.
Figure 14B:
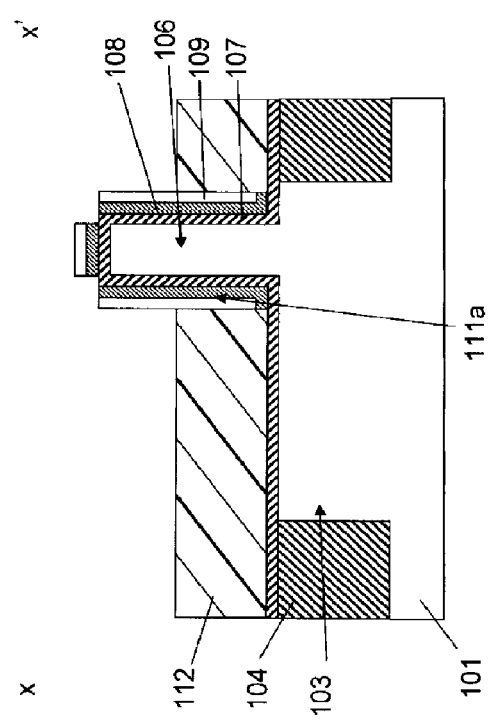
FIG. 14(b) is a cross-sectional view taken along line X-X' in FIG. 14(a).

As shown in FIG. 14, a fourth resist 112 is deposited, and the polysilicon film 109 on the sidewall of the upper portion of the pillar-shaped semiconductor layer 106 is exposed. Resist etching back is preferably used. Also, a coated film such as spin-on-glass may be used.

Figure 15A:
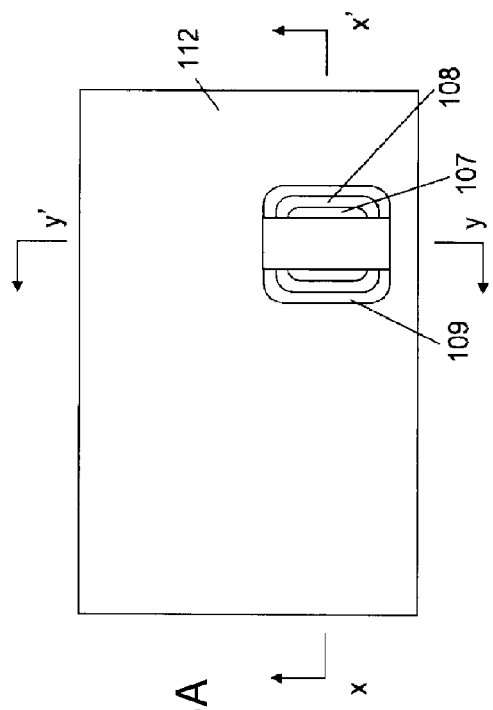
FIG. 15(a) is a plan view relating to a method for manufacturing a semiconductor device according to the present invention.
Figure 15C:
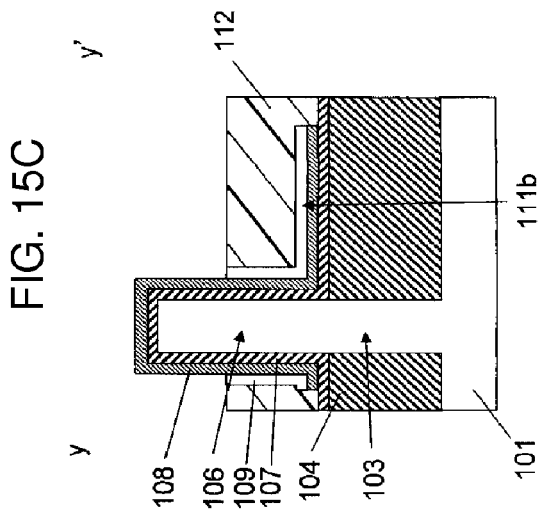
FIG. 15(c) is a cross-sectional view taken along line Y-Y' in FIG. 15(a).
Figure 15B:
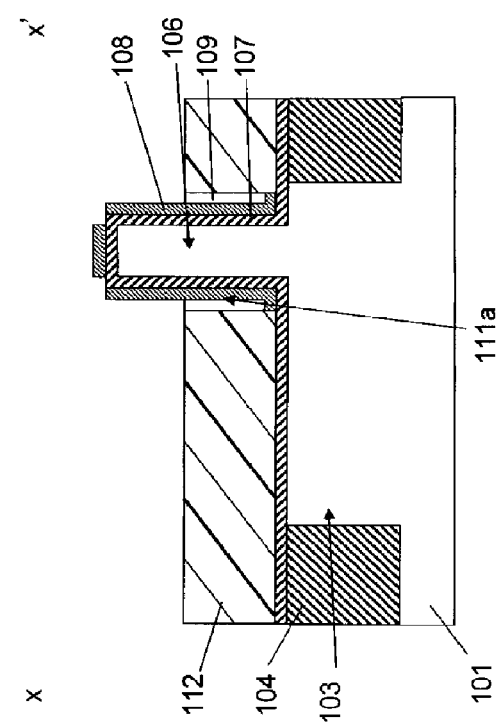
FIG. 15(b) is a cross-sectional view taken along line X-X' in FIG. 15(a).

As shown in FIG. 15, the exposed polysilicon film 109 is removed by etching. Isotropic etching is preferred.

As shown in FIG. 16, the fourth resist 112 is removed.

As shown in FIG. 17, the metal film 108 is removed by etching, leaving the metal film 108 on the sidewall of the pillar-shaped semiconductor layer 106. Isotropic etching is preferred.

The metal film 108 and the polysilicon 109 on the sidewall of the pillar-shaped semiconductor layer 106 form the gate electrode 111a. Therefore, a self-alignment process is established.

The above shows the second step of forming the gate insulating film around the pillar-shaped semiconductor layer, forming the gate electrode around the gate insulating film, and forming the gate line connected to the gate electrode.

Next, described is a third step of forming a first fist-conductivity-type diffusion layer in an upper portion of the pillar-shaped semiconductor layer and forming a second first-conductivity-type diffusion layer in a lower portion of the pillar-shaped semiconductor layer and in an upper portion of the fin-shaped semiconductor layer.

As shown in FIG. 18, a first fist-conductivity-type diffusion layer 114 and a second first-conductivity-type diffusion layer 113 are formed by implanting arsenic. In the case of pMOS, boron or boron fluoride is implanted.

Figure 19A:
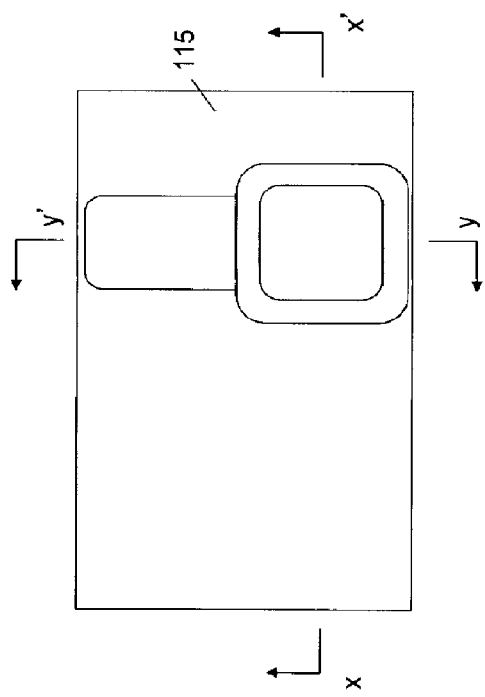
FIG. 19(a) is a plan view relating to a method for manufacturing a semiconductor device according to the present invention.
Figure 19B:
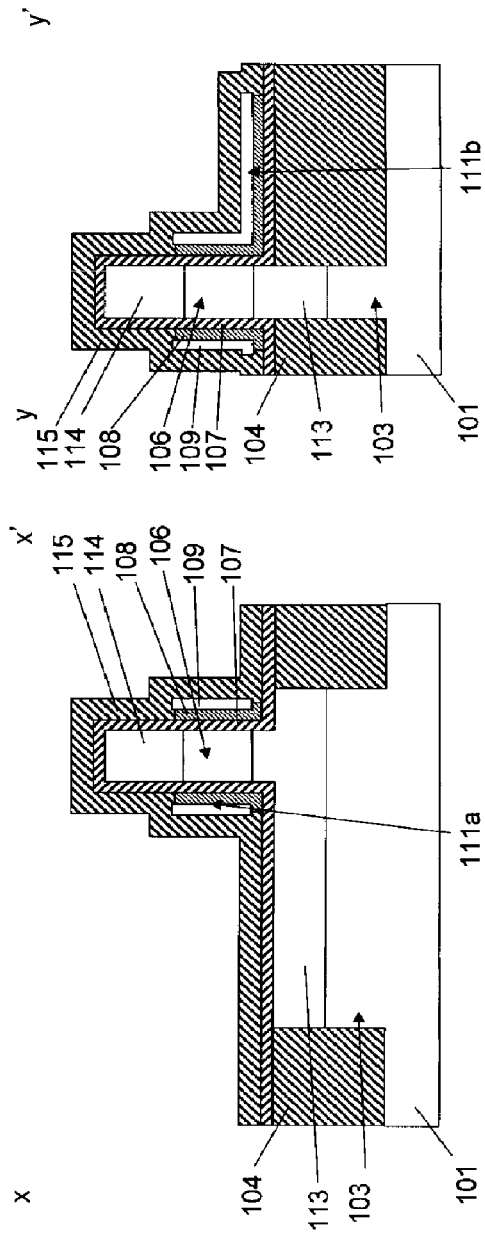
FIG. 19(b) is a cross-sectional view taken along line X-X' in FIG. 19(a).
Figure 19C:
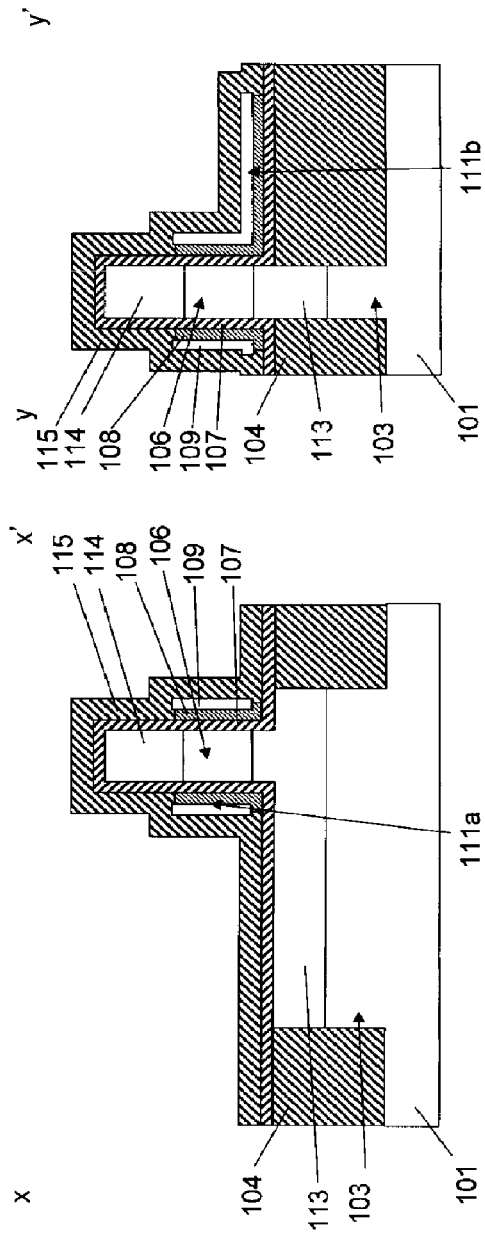
FIG. 19(c) is a cross-sectional view taken along line Y-Y' in FIG. 19(a).

As shown in FIG. 19, an oxide film 115 is deposited, and heat treatment is performed. A nitride film may be used.

The above shows the third step of forming the first fist-conductivity-type diffusion layer in an upper portion of the pillar-shaped semiconductor layer and forming the second first-conductivity-type diffusion layer in a lower portion of the pillar-shaped semiconductor layer and in an upper portion of the fin-shaped semiconductor layer.

Next, described is a manufacturing method for forming a first silicide 118 and a second silicide 117 on the first first-conductivity-type diffusion layer 114 and the second first-conductivity-type diffusion layer 113, respectively.

Figure 20A:
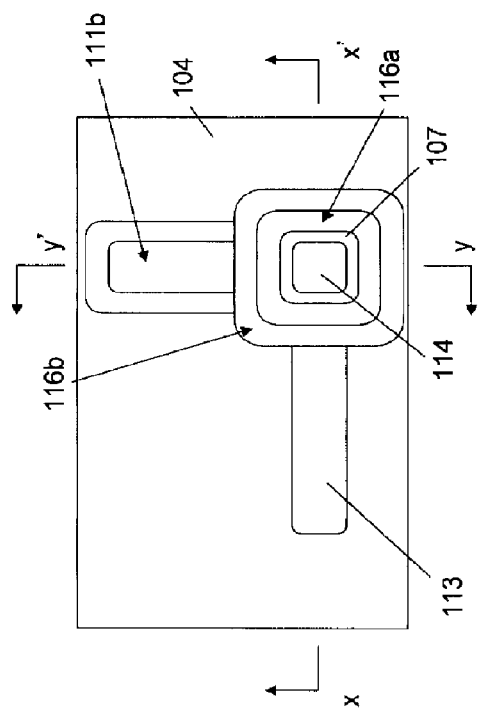
FIG. 20(a) is a plan view relating to a method for manufacturing a semiconductor device according to the present invention.
Figure 20B:
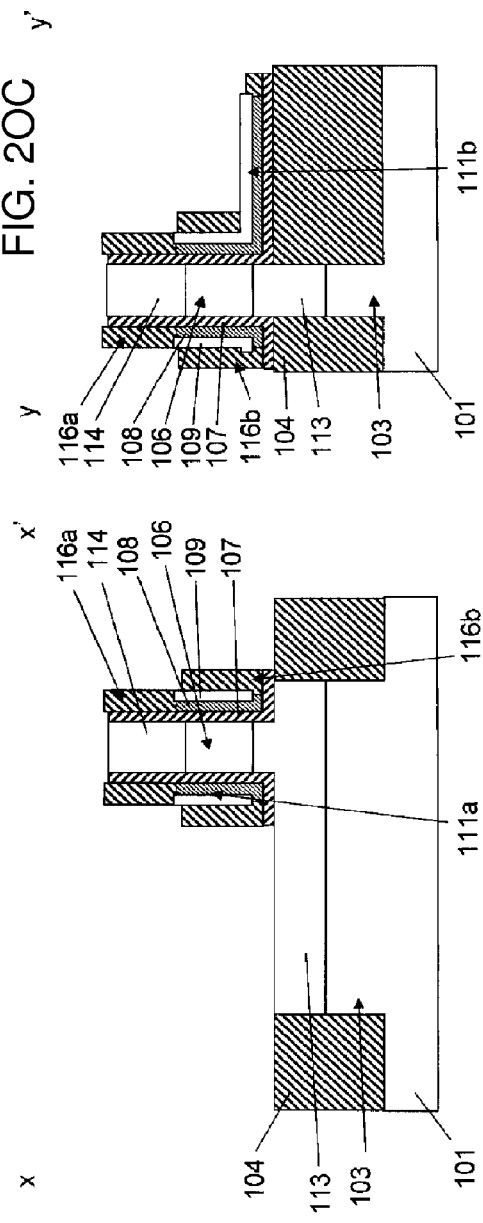
FIG. 20(b) is a cross-sectional view taken along line X-X' in FIG. 20(a).
Figure 20C:
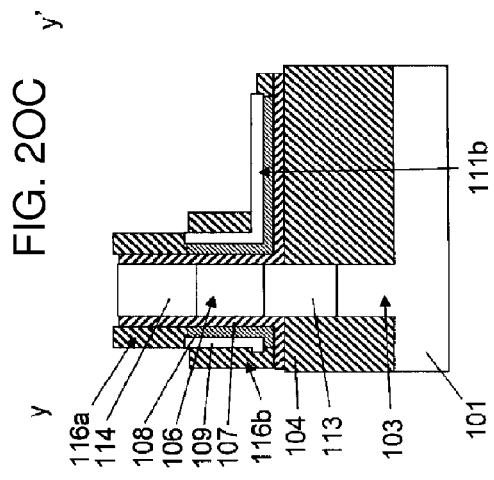
FIG. 20(c) is a cross-sectional view taken along line Y-Y' in FIG. 20(a).

As shown in FIG. 20, the oxide film 115 is etched to form oxide film sidewalls 116a and 116b.

Figure 21A:
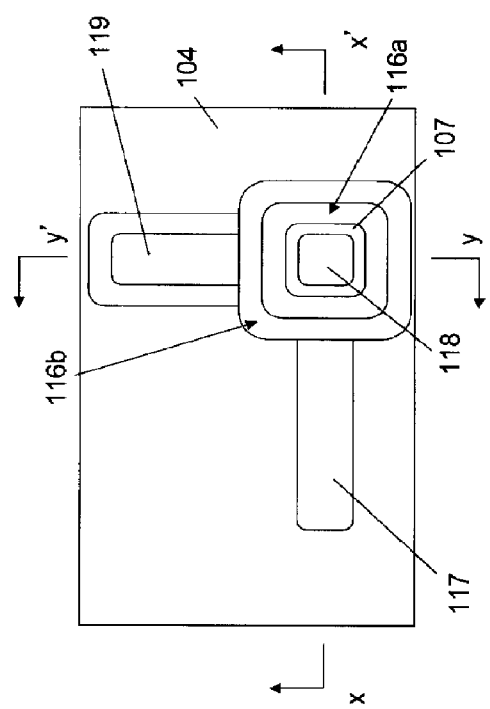
FIG. 21(a) is a plan view relating to a method for manufacturing a semiconductor device according to the present invention.
Figure 21B:
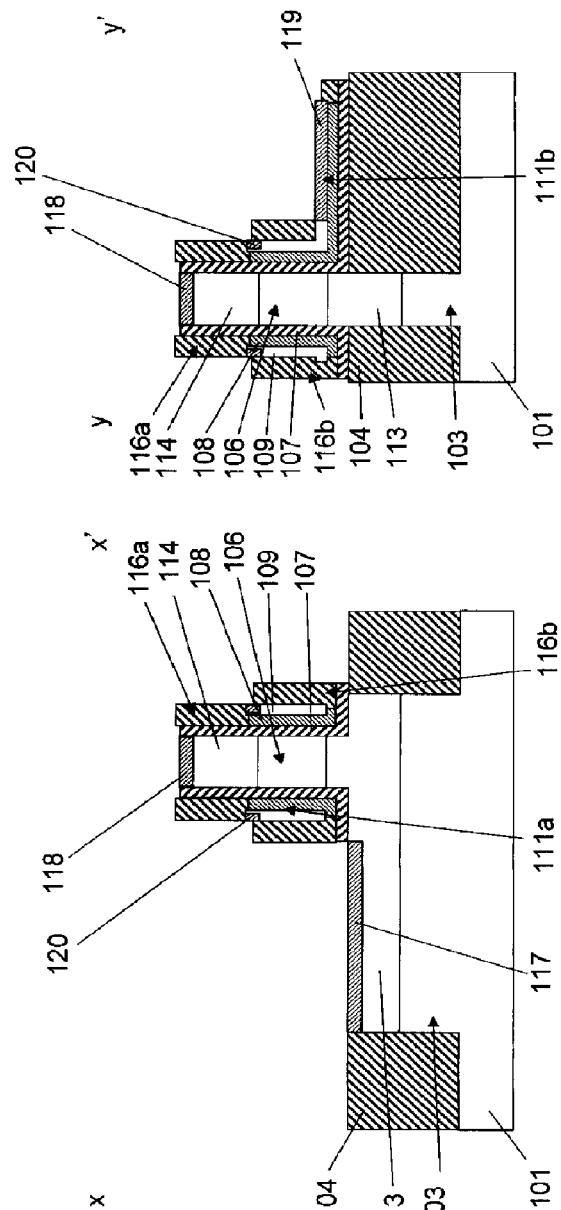
FIG. 21(b) is a cross-sectional view taken along line X-X' in FIG. 21(a).
Figure 21C:
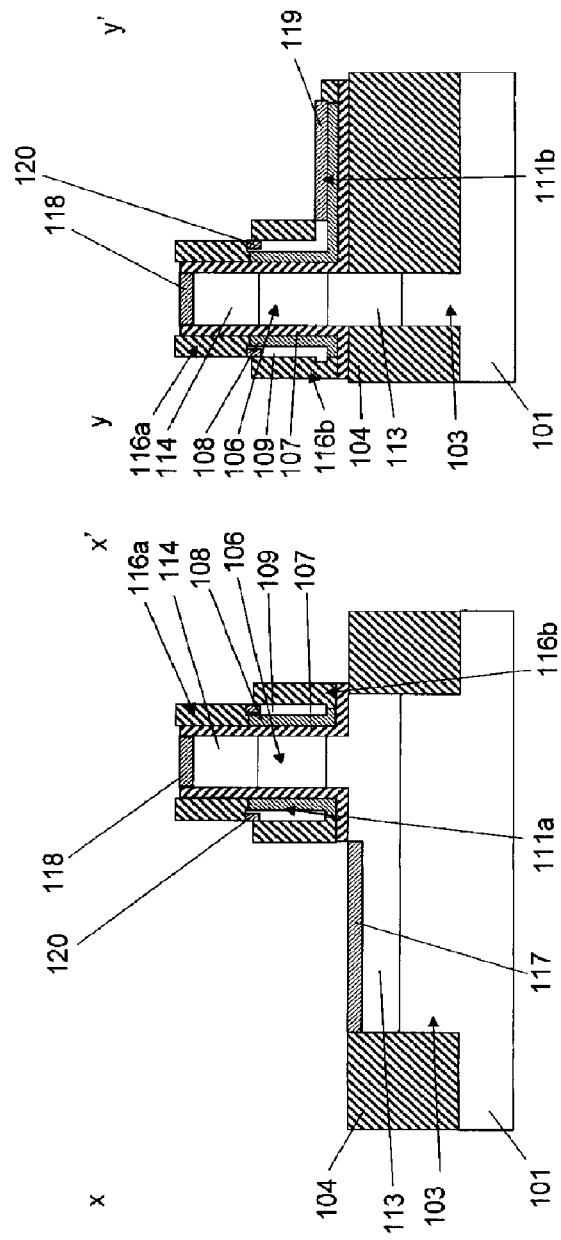
FIG. 21(c) is a cross-sectional view taken along line Y-Y' in FIG. 21(a).

Next, as shown in FIG. 21, a metal is deposited and heat-treated, and an unreacted metal is removed to form the first silicide 118, the second silicide 117, and a silicide 119 on the first first-conductivity-type diffusion layer 114, the second first-conductivity-type diffusion layer 113, and the gate line 111b, respectively. When an upper portion of the gate electrode 111a is exposed, a silicide 120 is formed on the upper portion of the gate electrode 111a.

Since the polysilicon film 109 is thin, the gate line 111b tends to have a laminated structure of the metal film 108 and the silicide 119. The resistance can be decreased due to direct contact between the silicide 119 and the metal film 108.

The above shows the manufacturing method for forming the first silicide 118, the second silicide 117, and a silicide 119 on the first first-conductivity-type diffusion layer 114 and the second first-conductivity-type diffusion layer 113, and the gate line 111b, respectively.

Next, described is a fourth step of depositing a first interlayer insulating film, planarizing and etching back the first interlayer insulating film to expose an upper portion of the pillar-shaped semiconductor layer, depositing a first metal after exposing an upper portion of the pillar-shaped semiconductor layer, and etching the metal to form a first sidewall composed of the metal around the sidewall of an upper portion of the pillar-shaped semiconductor layer.

As shown in FIG. 22, a first interlayer insulating film 121 is deposited and planarized.

As shown in FIG. 23, the first interlayer insulating film 121 is etched back to expose the sidewall of an upper portion of the pillar-shaped semiconductor layer 106.

As shown in FIG. 24, a first metal 122 is deposited. When the semiconductor layer is a silicon layer, and the first-conductivity-type diffusion layers are an n-type, the first metal preferably has a work function between 4.0 eV and 4.2 eV. Since the work function of n-type silicon is close to 4.05 eV, surface carriers are induced by a difference in work function, and thus the resistance of an upper portion of the pillar-shaped silicon layer can be decreased. For example, when a pillar-shaped silicon layer has a low impurity concentration, a transistor composed of a first sidewall and the pillar-shaped silicon layer is turned on with a voltage of 0 V applied to the first sidewall through a metal line. For example, a compound (TaTi) of tantalum and titanium or tantalum nitride (TaN) is preferred.

When the semiconductor layer is a silicon layer, and the first-conductivity-type diffusion layers are a p-type, the first metal preferably has a work function between 5.0 eV and 5.2 eV. Since the work function of p-type silicon is close to 5.15 eV, surface carriers are induced by a difference in work function, and thus the resistance of an upper portion of the pillar-shaped silicon layer can be decreased. For example, when a pillar-shaped silicon layer has a low impurity concentration, a transistor composed of a first sidewall and the pillar-shaped silicon layer is turned on with a voltage of 0 V applied to the first sidewall through a metal line. For example, ruthenium (Ru) or titanium nitride (TiN) is preferred.

As shown in FIG. 25, the first metal 122 is etched to form a first sidewall 122 composed of the metal around the sidewall of the upper portion of the pillar-shaped semiconductor layer 106. An area of contact between the metal and the upper portion of the pillar-shaped semiconductor layer is increased due to contact between the metal and the periphery of the sidewall of an upper portion of the pillar-shaped semiconductor layer 106, and thus the resistance of an upper portion of the pillar-shaped semiconductor layer can be decreased.

The above shows the fourth step of depositing the first interlayer insulating film, planarizing and etching back the first interlayer insulating film to expose an upper portion of the pillar-shaped semiconductor layer, depositing the first metal after exposing an upper portion of the pillar-shaped semiconductor layer, and etching the metal to form the first sidewall composed of the metal around the sidewall of an upper portion of the pillar-shaped semiconductor layer.

Next, described is a fifth step of depositing a second interlayer insulating film, planarizing and etching back the second interlayer insulating film to expose an upper portion of the pillar-shaped semiconductor layer, forming fifth resists for forming first contacts, etching the second interlayer insulating film and the first interlayer insulating film to form contact holes, depositing a second metal to form first contacts on the second first-conductivity-type diffusion layer, forming sixth resists for forming metal lines, and etching the second metal to form the first metal lines.

As shown in FIG. 26, a second interlayer insulating film 123 is deposited, and the second interlayer insulating film 123 is planarized and etched back to expose an upper portion of the pillar-shaped semiconductor layer 106.

As shown in FIG. 27, a fifth resist 124 for forming contact holes 125 and 126 is formed.

Figure 28A:
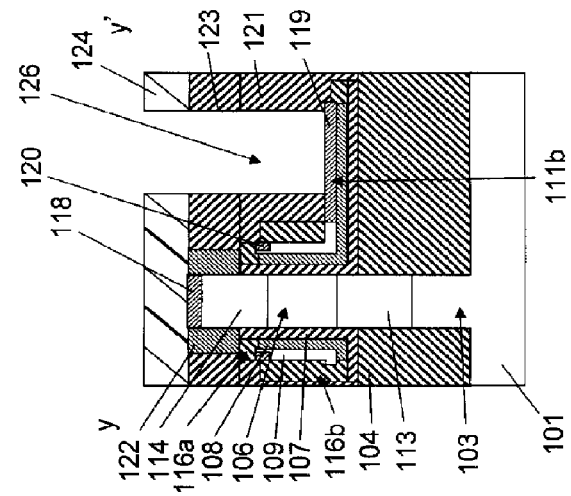
FIG. 28(a) is a plan view relating to a method for manufacturing a semiconductor device according to the present invention.
Figure 28B:
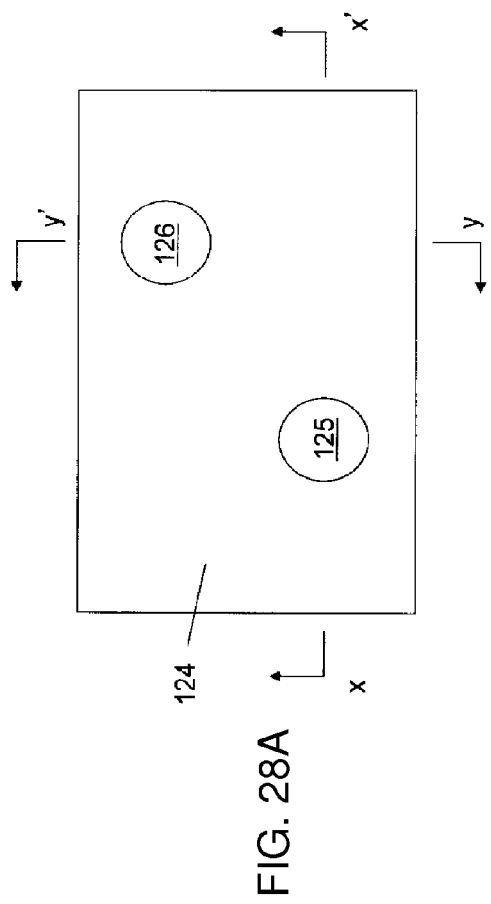
FIG. 28(b) is a cross-sectional view taken along line X-X' in FIG. 28(a).
Figure 28C:
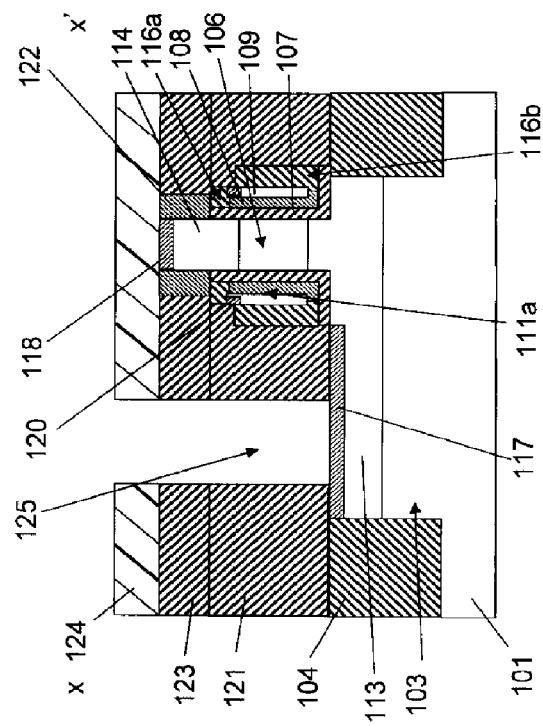
FIG. 28(c) is a cross-sectional view taken along line Y-Y' in FIG. 28(a).

As shown in FIG. 28, the second interlayer insulating film 123 and the first interlayer insulating film 121 are etched to form the contact holes 125 and 126.

As shown in FIG. 29, the fifth resist 124 is removed.

As shown in FIG. 30, a second metal 127 is deposited to form first contacts 128 and 129. A step of forming a contact with an upper portion of the pillar-shaped semiconductor layer is not required because of direct contact between the first metal line and an upper portion of the pillar-shaped semiconductor layer. Also, a contact hole for first contact can be made shallow, thereby facilitating the formation of a contact hole and filling the contact hole with a metal. Also, an upper portion of the pillar-shaped semiconductor layer 106, an upper portion of the first sidewall 122, and the second metal come in contact with each other, and thus the resistance of an upper portion of the pillar-shaped semiconductor layer can be decreased.

As shown in FIG. 31, sixth resists 130, 131, 132 for forming first metal lines are formed.

As shown in FIG. 32, the second metal 127 is etched to form first metal lines 133, 134, and 135.

As shown in FIG. 33, the sixth resists 130, 131, and 132 are removed.

The above shows the fifth step of depositing the second interlayer insulating film, planarizing and etching back the second interlayer insulating film to expose an upper portion of the pillar-shaped semiconductor layer, forming the fifth resists for forming the first contacts, etching the second interlayer insulating film and the first interlayer insulating film to form the contact holes, depositing the second metal to form the first contacts on the second first-conductivity-type diffusion layer, forming the sixth resists for forming metal lines, and etching the second metal to form the first metal lines.

FIG. 1 shows a structure of a semiconductor device manufactured by the above-described manufacturing method.

As shown in FIG. 1, a semiconductor device manufactured by the above-described method includes the fin-shaped semiconductor layer 103 formed on the semiconductor substrate 101, the pillar-shaped semiconductor layer 106 formed on the fin-shaped semiconductor layer 103, the gate insulating film 107 formed around the pillar-shaped semiconductor layer 106, the gate electrode 111a formed around the gate insulating film 107, the gate line 111b connected to the gate electrode 111a, the first first-conductivity-type diffusion layer 114 formed in an upper portion of the pillar-shaped semiconductor layer 106, the second first-conductivity-type diffusion layer 113 formed in a lower portion of the pillar-shaped semiconductor layer 106 and in an upper portion of the fin-shaped semiconductor layer 103, and the first sidewall 122 composed of the first metal and formed around the sidewall of an upper portion of the pillar-shaped semiconductor layer 106.

The semiconductor device further includes the first metal line formed on an upper portion of the pillar-shaped semiconductor layer 106 and on the first sidewall 122.

Also, the first sidewall 122 may have a laminated structure of the gate insulating film 107 and the first metal 122 as shown in FIG. 34. Surface carriers are induced by a difference in work function, and thus the resistance of an upper portion of the pillar-shaped semiconductor layer can be decreased.

When the semiconductor layer is a silicon layer, and the first-conductivity-type diffusion layers are an n-type, the first metal preferably has a work function between 4.0 eV and 4.2 eV. Since the work function of n-type silicon is close to 4.05 eV, surface carriers are induced by a difference in work function, and thus the resistance of an upper portion of the pillar-shaped silicon layer can be decreased. For example, when a pillar-shaped silicon layer has a low impurity concentration, a transistor composed of a first sidewall and the pillar-shaped silicon layer is turned on with a voltage of 0 V applied to the first sidewall through a metal line. For example, a compound (TaTi) of tantalum and titanium or tantalum nitride (TaN) is preferred.

When the semiconductor layer is a silicon layer, and the first-conductivity-type diffusion layers are a p-type, the first metal preferably has a work function between 5.0 eV and 5.2 eV. Since the work function of p-type silicon is close to 5.15 eV, surface carriers are induced by a difference in work function, and thus the resistance of an upper portion of the pillar-shaped silicon layer can be decreased. For example, when a pillar-shaped silicon layer has a low impurity concentration, a transistor composed of a first sidewall and the pillar-shaped silicon layer is turned on with a voltage of 0 V applied to the first sidewall through a metal line. For example, ruthenium (Ru) or titanium nitride (TiN) is preferred.

In the present invention, various embodiments and modifications can be made without deviating from the broad spirit and scope of the present invention. Also, the above-described embodiments are illustrative of the present invention, and the scope of the present invention is not limited.

For example, the technical scope of the present invention, of course, includes a method for manufacturing a semiconductor device in which a p-type (including a $p^+$-type) and an n-type (including an $n^+$-type) in the above-described embodiment are reversed, and a semiconductor device manufactured by the method.

The invention claimed is:

1. A method of manufacturing a semiconductor device, the method comprising:
   a first step of forming a fin-shaped semiconductor layer on a semiconductor substrate, forming a first insulating film around the fin-shaped semiconductor layer, and forming a pillar-shaped semiconductor layer in an upper portion of the fin-shaped semiconductor layer;
   a second step of forming a gate insulating film around the pillar-shaped semiconductor layer, forming a gate electrode around the gate insulating film, and forming a gate line connected to the gate electrode;
   a third step of forming a first first-conductivity-type diffusion layer in an upper portion of the pillar-shaped semiconductor layer and forming a second first-conductivity-type diffusion layer in a lower portion of the pillar-shaped semiconductor layer and in an upper portion of the fin-shaped semiconductor layer; and
   a fourth step of depositing a first interlayer insulating film, planarizing and etching-back the first interlayer insulating film to expose an upper portion of the pillar-shaped semiconductor layer, depositing a first metal after exposing the upper portion of the pillar-shaped semiconductor layer, and etching the metal to form a first sidewall composed of the metal around the sidewall of the upper portion of the pillar-shaped semiconductor layer.

2. The method for manufacturing a semiconductor device according to claim 1, comprising, after the fourth step,
   a fifth step of depositing a second interlayer insulating film, planarizing and etching-back the second interlayer insulating film to expose an upper portion of the pillar-shaped semiconductor layer, forming a fifth resist for forming a first contact, etching the second interlayer insulating film and the first interlayer insulating film to form a contact hole, depositing a second metal to form a first contact on the second first-conductivity-type diffusion layer, forming a sixth resist for forming a metal line, and forming a first metal line by etching.

3. The method for manufacturing a semiconductor device according to claim 1, wherein the semiconductor layers are silicon layers.

4. The method for manufacturing a semiconductor device according to claim 3, wherein:
   the first-conductivity-type diffusion layers are an n-type; and
   the metal of the first sidewall has a work function between 4.0 eV and 4.2 eV.

5. The method for manufacturing a semiconductor device according to claim 3, wherein:
   the first-conductivity-type diffusion layers are a p-type; and
   the metal of the first sidewall has a work function between 5.0 eV and 5.2 eV.

6. A semiconductor device, comprising:
   a fin-shaped semiconductor layer formed on a semiconductor substrate;
   a pillar-shaped semiconductor layer formed on the fin-shaped semiconductor layer;
   a gate insulating film formed around said pillar-shaped semiconductor layer;
   a gate electrode formed around said gate insulating film;
   a gate line connected to said gate electrode;
   a first first-conductivity-type diffusion layer formed in an upper portion of said pillar-shaped semiconductor layer;
   a second first-conductivity-type diffusion layer formed in a lower portion of said pillar-shaped semiconductor layer and in an upper portion of said fin-shaped semiconductor layer; and
   a first sidewall composed of a first metal and formed around a sidewall of an upper portion of said pillar-shaped semiconductor layer.

7. The semiconductor device according to claim 6, further comprising a first metal line formed on an upper portion of said pillar-shaped semiconductor layer and on said first sidewall.

8. The semiconductor device according to claim 6, wherein said semiconductor layers are silicon layers.

9. The semiconductor device according to claim 8, wherein:
   said first-conductivity-type diffusion layers are an n-type; and
   said metal of said first sidewall has a work function between 4.0 eV and 4.2 eV.

10. The semiconductor device according to claim 8, wherein:
    said first-conductivity-type diffusion layers are a p-type; and
    said metal of said first sidewall has a work function between 5.0 eV and 5.2 eV.

11. The semiconductor device according to claim 7, comprising a first contact formed on said second first-conductivity-type diffusion layer, and wherein a depth of said first contact is equal to or smaller than a height of said pillar-shaped semiconductor layer.

12. The semiconductor device according to claim 11, wherein a width of said pillar-shaped semiconductor layer is equal to a width of said fin-shaped semiconductor layer.

13. The semiconductor device according to claim 9, wherein said first sidewall has a laminated structure of said gate insulating film and said first metal.

* * * * *